(12) United States Patent
Koyama et al.

(10) Patent No.: US 8,421,184 B2
(45) Date of Patent: Apr. 16, 2013

(54) SEMICONDUCTOR DEVICE

(75) Inventors: Masaki Koyama, Nukata-gun (JP);
Yutaka Fukuda, Kariya (JP); Yoshiko Fukuda, legal representative, Kariya (JP); Yuji Fukuda, legal representative, Osaka (JP); Mika Ootsuki, legal representative, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/129,980

(22) PCT Filed: May 17, 2010

(86) PCT No.: PCT/JP2010/003296
§ 371 (c)(1),
(2), (4) Date: May 18, 2011

(87) PCT Pub. No.: WO2011/001588
PCT Pub. Date: Jan. 6, 2011

(65) Prior Publication Data
US 2011/0285427 A1 Nov. 24, 2011

(30) Foreign Application Priority Data

Jun. 29, 2009 (JP) .................................. 2009-153958
May 10, 2010 (JP) .................................. 2010-108608

(51) Int. Cl.
*H01L 31/058* (2006.01)
*H03K 17/78* (2006.01)
(52) U.S. Cl.
USPC ............ 257/512; 257/E29.262; 257/E29.198; 327/512
(58) Field of Classification Search ............ 257/48, 257/139, E29.262, E29.198, 467, 594, 618; 327/109, 83, 138, 512
See application file for complete search history.

(56) References Cited

U.S. PATENT DOCUMENTS

| 5,381,026 A | 1/1995 | Shinohe et al. |
| 5,464,994 A | 11/1995 | Shinohe et al. |

(Continued)

FOREIGN PATENT DOCUMENTS

| JP | H05-190835 A | 7/1993 |
| JP | 08-088349 A | 4/1996 |

(Continued)

OTHER PUBLICATIONS

Partial International Search Report mailed on Jun. 22, 2010 for the corresponding International patent application No. PCT/JP2010/003296 (and English translation).

(Continued)

*Primary Examiner* — Thomas L Dickey
(74) *Attorney, Agent, or Firm* — Posz Law Group, PLC

(57) ABSTRACT

A semiconductor device includes: a semiconductor substrate having a first semiconductor layer and a second semiconductor layer formed on a first surface; a diode having a first electrode and a second electrode; a control pad; a control electrode electrically coupled with the control pad; and an insulation member. The first electrode is formed on a second surface of the first semiconductor layer. The second electrode is formed on the first surface. Current flows between the first electrode and the second electrode. The control pad is arranged on the first surface so that the pad inputs a control signal for controlling an injection amount of a carrier into the first semiconductor layer. The insulation member insulates between the control electrode and the second electrode and between the control electrode and the semiconductor substrate.

25 Claims, 19 Drawing Sheets

U.S. PATENT DOCUMENTS

| | | |
|---|---|---|
| 5,619,047 A | 4/1997 | Bauer |
| 5,714,775 A | 2/1998 | Inoue et al. |
| 5,793,065 A | 8/1998 | Shinohe et al. |
| 6,069,371 A | 5/2000 | Omura et al. |
| 6,236,069 B1 | 5/2001 | Shinohe et al. |
| 6,323,509 B1 | 11/2001 | Kusunoki |
| 6,605,830 B1 | 8/2003 | Kusunoki |
| 7,091,579 B2 | 8/2006 | Nemoto |
| 7,582,939 B2 | 9/2009 | Bakran et al. |
| 2004/0119088 A1* | 6/2004 | Fukuda et al. ............ 257/107 |
| 2007/0170549 A1 | 7/2007 | Tsuzuki et al. |
| 2008/0297233 A1 | 12/2008 | Tokunaga |
| 2010/0072546 A1 | 3/2010 | Takaishi |
| 2010/0123188 A1* | 5/2010 | Venkatraman ............ 257/330 |

FOREIGN PATENT DOCUMENTS

| | | |
|---|---|---|
| JP | A-H08-088349 | 4/1996 |
| JP | 09-107097 A | 4/1997 |
| JP | 10-163469 A | 6/1998 |
| JP | 10-173170 A | 6/1998 |
| JP | A-2001-320049 | 11/2001 |
| JP | 2003-101020 A | 4/2003 |
| JP | 2004-134712 A | 4/2004 |
| JP | 2004-363327 A | 12/2004 |
| JP | 2006-344779 A | 12/2006 |
| JP | 2008-078375 A | 4/2008 |
| WO | WO 2009/034851 A1 | 3/2009 |
| WO | WO 2009/101868 A1 | 8/2009 |

OTHER PUBLICATIONS

Written Opinion of the International Search Authority mailed on Aug. 24, 2010 for the corresponding International patent application No. PCT/JP2010/003296 (and English translation).

Office Action mailed Nov. 6, 2012 in corresponding JP Application No. 2008-294481 (and English translation).

\* cited by examiner

SEMICONDUCTOR DEVICE

CROSS REFERENCE TO RELATED APPLICATIONS

This application is a U.S. national stage application of PCT/JP2010/003296 filed on May 18, 2011 and is based on Japanese Patent Applications No. 2009-153958 filed on Jun. 29, 2009, No. 2008-294481 filed on Nov. 18, 2008, and No. 2010-108608 filed on May 10, 2010, the disclosures of which are incorporated herein by reference.

TECHNICAL FIELD

The present invention relates to a semiconductor device having a diode. Specifically, the present invention relates to an insulated gate type semiconductor device such as an insulated gate type transistor (e.g., an IGBT) having a trench gate structure.

BACKGROUND

Conventionally, for example, as described in JP-A-2003-318412, a semiconductor device having a diode for flowing current between an anode layer and a cathode layer is disclosed. The anode layer, a drift layer having an impurity concentration lower than the anode layer, and the cathode layer having an impurity concentration higher than the drift layer are stacked in this order.

Here, one of general performance required to the diode is low power loss. The power loss of the diode is shown as a sum of a stationary loss and a switching loss. The stationary loss is generated when forward current flows, and the switching loss is generated when a reverse current flows. The stationary loss has characteristics such that the stationary loss is reduced when an injection amount of a minority carrier to the drift layer becomes large. The switching loss has characteristics such that the switching loss is reduced when the injection amount of a minority carrier to the drift layer becomes small. Accordingly, a relationship between the stationary loss and the switching loss is a trade off relationship. On the other hand, in a conventional technique, the injection amount of the minority carrier is adjusted by controlling an impurity concentration distribution of the anode layer and the drift layer and/or by patterning the anode layer so that the stationary loss and the switching loss are adjusted.

However, since each of the above adjusting methods is performed during a manufacturing process of the diode (i.e., the semiconductor device), the injection amount and the accumulation amount of the minority carrier cannot be adjusted flexibly after the semiconductor device is manufactured. Thus, a problem occurs such that the stationary loss and the switching loss are not controlled. The stationary loss and the switching loss of the diode are varied according to usage environment of the semiconductor device. Thus, it is required to control them according to the usage environment.

Here, another method for controlling the stationary loss and the switching loss is a method for irradiating an electron beam on the drift layer so that a lifetime of the minority carrier is adjusted. However, this adjusting method is also performed during the manufacturing process of the semiconductor device. Thus, after the semiconductor device is manufactured, the stationary loss and the switching loss are not adjusted flexibly.

Further, a loss of a high breakdown voltage insulated gate type semiconductor device such as a trench gate type IGBT includes the stationary loss and the switching loss. These loss characteristics depend on the injection amount of the minority carrier from a collector.

FIG. 30 shows a cross sectional view of a conventional N channel type IGBT. As shown in this drawing, a N− type drift layer 302 is formed on a surface of a P+ type substrate 301 via a field stop layer (i.e., FS layer) 302a. The substrate 301 provides a collector region, and the FS layer 302a functions as a buffer layer. A trench gate structure is formed in a surface portion of the N− type drift layer 302. Specifically, a P type base region 303 is formed in the surface portion of the N− type drift layer 302. Further, a trench 304 is formed to penetrate the p type base region 303. The P type base region 303 is divided into multiple portions by the trench 304. A N+ type emitter region 305 is formed in a part of the portions of the region 303 so that a channel P layer 303a is formed. The N+ type emitter region 305 is not formed in the other part of the portions of the region 303 so that a float layer 303b is formed. Further, a gate electrode 307 is formed in the trench 304 via a gate insulation film 306. The gate electrode 307 contacting the channel P layer 303a provides the gate electrode 307a for applying a gate voltage. The gate electrode 307 not contacting the channel P layer 303a provides a dummy gate electrode 307b for a dummy electrode.

In the above IGBT, when an injection amount of a hole from the P+ type substrate 301 as the collector region is large in the on state, many holes are accumulated by using the FS layer 302a. Thus, a conductivity change is promoted largely. Thus, the stationary loss is reduced. On the other hand, in the IGBT, when the accumulation amount of the hole is large in the on state, a time period to remove the holes in case of turning off becomes large. Thus, a turn off loss increases.

Accordingly, it is required to control and design a balance between the stationary loss and the switching loss according to a driving frequency for usage so that a total loss of the stationary loss and the switching loss is minimized.

Accordingly, conventionally, in the life time control technique with using the electron beam irradiation, as shown in FIG. 30, a FS type IGBT is proposed such that the P+ type substrate 301 providing the collector region is polished to be thin, and the N+ type FS layer 302a is formed between the P+ type substrate 301 and the N− type drift layer 302. This is disclosed in, for example, JP-2003-101020.

In the lifetime control technique, the electron beam or the like is irradiated on the device, and then, the device is annealed in the manufacturing process of the device, so that a recombination center is generated in the drift layer. Thus, the lifetime of the minority carrier is adjusted. Accordingly, transport efficiency of the minority carrier is adjusted, and the design of the loss is optimized. In the FS type IGBT, a difference between a concentration in the P+ type substrate 301 for providing the collector region on the backside and a concentration in the N+ type FS layer 302a is controlled in the manufacturing process of the device so that the injection amount of the hole (i.e., the minority carrier) is adjusted. Thus, the design of the loss is optimized. With using these techniques, the injection of the minority carrier is optimized or the transport efficiency is adjusted according to an application of the device.

However, the above techniques are applied to customize the device in the manufacturing process of the device. Thus, the techniques lack general versatility of the device. Further, even in one application of the device, the environmental conditions such as temperature and operating conditions such as a driving frequency are varied. Thus, the techniques cannot match the change of conditions.

SUMMARY

In view of the above-described difficulties, it is an object of the present disclosure to provide a semiconductor device capable of adjusting a stationary loss and a switching loss even after the semiconductor device is manufactured. Further, in view of the above-described difficulties, it is an object of the present disclosure to provide a semiconductor device capable of optimizing the stationary loss and the switching loss after a manufacturing process of the device ends.

According to a first aspect of the present disclosure, a semiconductor device includes: a semiconductor substrate including a first semiconductor layer having a first conductive type and at least one second semiconductor layer having a second conductive type and formed in a surface portion of a first surface of the first semiconductor layer; a diode including a first electrode and a second electrode; a control pad; a control electrode electrically coupled with the control pad; and an insulation member. The first electrode is formed on a second surface of the first semiconductor layer. The second electrode is formed on the first surface of the first semiconductor layer. Current flows between the first electrode and the second electrode. The control pad is arranged on the first surface of the first semiconductor layer, and the pad inputs a control signal for controlling an injection amount of a carrier into the first semiconductor layer. The insulation member insulates between the control electrode and the second electrode and between the control electrode and the semiconductor substrate.

In the above device, even after the semiconductor device is formed, the semiconductor device can adjust a stationary loss and a switching loss flexibly by controlling the control signal.

According to a second aspect of the present disclosure, a semiconductor device includes: a collector layer having a first conductive type; a drift layer having a second conductive type and arranged on the collector layer; a base region having the first conductive type and formed on the drift layer in a cell region; a first trench extending along with one direction as a longitudinal direction and formed to penetrate the base region and to reach the drift region so that the base region is divided into a plurality of portions; an emitter region having the second conductive type and formed at least a part of the divided portions of the base region to contact a sidewall of the first trench in the base region; a gate insulation film formed on an inner surface of the first trench; a gate electrode formed on the gate insulation film in the first trench; an emitter electrode electrically coupled with the emitter region, and a collector electrode formed on a backside of the collector layer; a second trench formed on the backside of the collector layer, which is opposite to the drift layer; a gate insulation film formed on an inner surface of the second trench; and a control gate electrode formed on the gate insulation film in the second trench. The collector layer, the drift layer, the base region, the trench, the emitter region, the gate insulation film, the gate electrode and the collector electrode provide an insulated gate type semiconductor device.

Thus, the control gate electrode for adjusting a carrier amount in the collector layer is disposed in the cell region, in which the insulated gate type semiconductor device is arranged. Accordingly, after a manufacturing process of the device is completed, the semiconductor device can adjust the stationary loss and the switching loss appropriately.

BRIEF DESCRIPTION OF THE DRAWINGS

The above and other aspects, features and advantages of the present invention will become more apparent from the following detailed description made with reference to the accompanying drawings. In the drawings.

DETAILED DESCRIPTION (First Example Embodiment)

Figure 1:
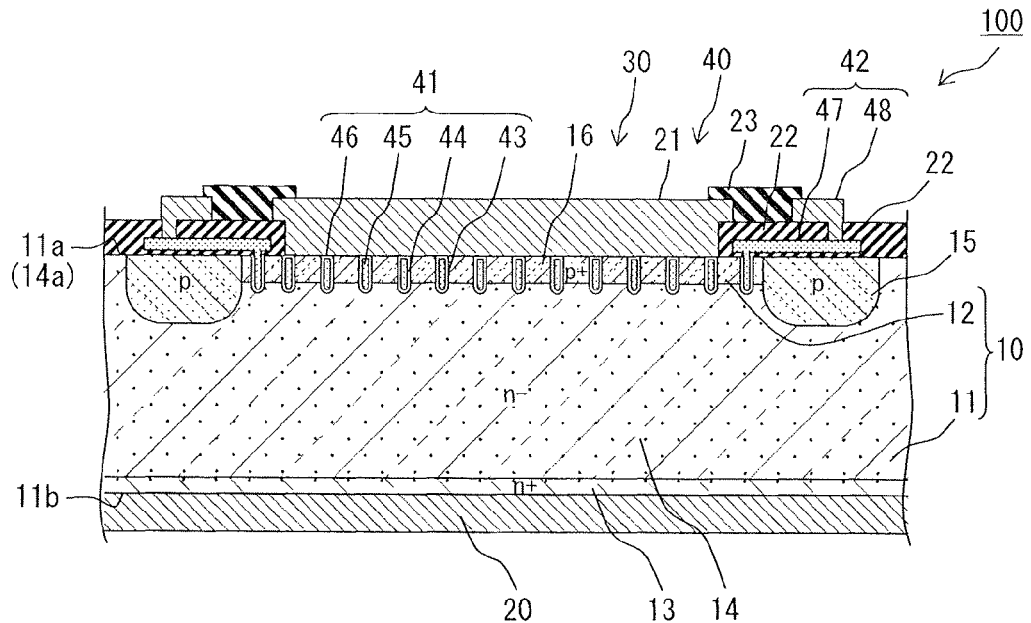
FIG. 1 is a cross sectional view showing a construction of a semiconductor device according to a first embodiment.

FIG. 1 is a cross sectional view showing a construction of a semiconductor device according to a first embodiment. Here, a thickness direction of a semiconductor substrate 10 is defined as a thickness direction, a direction to arrange control electrodes 41 in parallel is defined as a lateral direction, a direction perpendicular to the thickness direction and the lateral direction is defined as a depth direction.

As shown in FIG. 1, a semiconductor device 100 includes a diode 30 formed in a semiconductor substrate 10. The semiconductor substrate 10 includes a first semiconductor layer 11 having a N conductive type, and a second semiconductor layer 12 having a P conductive type and formed in a surface portion of a principal surface 11a of the first semiconductor layer 11. A first electrode 20 is formed on the other side 11b of the first semiconductor layer 11. A second electrode 21 is formed on the principal surface 11a of the first semiconductor layer 11. The second semiconductor layer 12 provides a well region formed locally in a surface portion of the principal surface 11a of the first semiconductor layer 11.

As shown in FIG. 1, the first semiconductor layer 11 includes a high concentration layer 13 for securing ohmic contact with the first electrode 20 and a low concentration layer 14 for securing a breakdown voltage of the semiconductor substrate 10. The impurity concentration of the low concentration layer 14 is lower than the impurity concentration of the high concentration layer 13 and the second semiconductor layer 12. A second semiconductor layer 12 and a well region 15 having a P conductive type and adjacent to an end of the second semiconductor layer 12 are formed in a surface portion of the surface 14a of the low concentration layer 14. The well region 15 functions to absorb a carrier accumulated near both ends of the second semiconductor layer 12 in the low concentration layer 14 when a reverse current flows through the diode 30. The second semiconductor layer 12 and the well region 15 are formed by introducing an impurity on the principal surface 11a of the first semiconductor layer 11 by an ion implantation method or a diffusion method. Here, the surface 14a corresponds to the principal surface 11a.

As shown in FIG. 1, the first electrode 20 is formed on a whole surface of the other side 11b of the first semiconductor layer 11. The second electrode 21 is formed in a region of the principal surface 11a, in which the second semiconductor layer 12 is formed. The first electrode 20 contacts with a whole of the other side 11b of the first semiconductor layer 11. However, the second electrode 21 contacts the second semiconductor layer 12 and a second insulation film 46, which is later described. An end of the second electrode 21 is adjacent to a later described third electrode 48 via the insulation film 22. A part of the second electrode 21 is covered and protected with a protection film 23. A portion of the second electrode 21 exposed from the protection film 23 is coupled with a terminal for connecting to a certain circuit.

The diode 30 has a PN junction provided by the low concentration layer 14 and the second semiconductor layer 12. An electric power loss of the diode 30 is provided by a sum of a stationary loss and a switching loss. The stationary loss is generated when a forward current flows between the first electrode 20 as a cathode electrode and the second electrode 21 as an anode electrode, and the switching loss is generated when a reverse current flows between the first electrode 20 and the second electrode 21. The stationary loss has characteristics such that the stationary loss is reduced when the injection amount of a minority carrier to the first semiconductor layer 11 becomes large. The switching loss has characteristics such that the switching loss is reduced when the injection amount (i.e., the accumulation amount) of the minority carrier to the first semiconductor layer 11 becomes small. Accordingly, a relationship between the stationary loss and the switching loss is a trade off relationship. In the present embodiment, the stationary loss and the switching loss are controllable (i.e., adjustable) with using a controller 40.

The controller 40 controls (i.e., adjusts) the injection amount of the carrier penetrating into the first semiconductor layer 11. The controller 40 includes multiple control electrodes 41 and a control pad 42, in which the control signal for controlling the injection amount of the minority carrier into the first semiconductor layer 11 is input.

The control electrode 41 has a feature such that a top end of the control electrode 41 protrudes from the principal surface 11a into the low concentration layer 14, and includes a trench 43 formed in the second semiconductor layer 12, a first insulation film 44 formed on an inner wall of the trench 43, a conductive member 45 filling a concavity formed on the first insulation film 44, and a second insulation film 46 covering a part of an opening of the concavity. As shown in FIG. 1, the trench 43 is formed along with the lateral direction in parallel to each other. Although not shown in the drawing, the trench 43 extends along with the depth direction such that the trench 43 provides a stripe pattern with respect to a plane formed by the depth direction and the lateral direction. The conductive member 45 is covered with the insulation films 44, 46 so that the member 45 is insulated from the second electrode 21 and the semiconductor layers 11, 12. Each of the conductive member 45 (i.e., the control electrode 41) formed along with the lateral direction in parallel to each other is covered with the insulation films 22, 46. The conductive member 45 is electrically coupled with each other via a connection electrode (not shown), which extends along with the lateral direction. Here, the insulation films 44, 46 provide an insulation member.

The control pad 42 includes a retrieve electrode 47 and a third electrode 48. The retrieved electrode 47 is formed on the well region 15 on the principal surface 11a of the first semiconductor layer 11 via the second insulation film 46. The third electrode 48 is electrically coupled with the retrieve electrode 47. As shown in FIG. 1, the retrieve electrode 47 is electrically coupled with one of the conductive members 45. Further, the retrieve electrode 47 is covered with the insulation films 22, 46. A part of the retrieve electrode 47 exposed from the insulation films 22, 46 is electrically coupled with the third electrode 48. The third electrode 48 is covered with and protected by the protection film 23. A part of the third electrode 48 exposed from the protection film 23 is connected to a control terminal (not shown) for coupling with a later described control circuit (not shown).

The control circuit generates the control signal for controlling the injection amount of the minority carrier penetrating into the first semiconductor layer 11. As described above, the control circuit and the control pad 42 are electrically coupled with each other via the control terminal. Thus, the control signal output from the control circuit is input into the conductive member 45 (i.e., the control electrode 41) via the control terminal, the third electrode 48 and the retrieve electrode 47.

Next, functions and effects of the semiconductor device 100 according to the present embodiment will be explained. As described above, the semiconductor device 100 includes the controller 40 for controlling (i.e., adjusting) the injection amount of the minority carrier penetrating into the first semiconductor layer 11. For example, when the positive control signal is input into the control pad 42 from the control circuit so that the potential of the control electrode 41 becomes equal to the control signal, electrons are accumulated in a region of the second semiconductor layer 12 (i.e., a facing region 16), which faces the control electrode 41 via the first insulation film 44. When the electrons are accumulated, a hole concentration in the second semiconductor layer 12 is reduced. Thus, the impurity concentration in the facing region 16 becomes low apparently. Thus, the injection amount of the minority carrier from the facing region 16 (i.e., the second semiconductor layer 12) to the first semiconductor layer 11 (i.e., the low concentration layer 14) is reduced, and therefore, the switching loss is reduced. On the other hand, when the negative control signal is input into the control pad 42 from the control circuit so that the potential of the control electrode 41 becomes equal to the control signal, the holes are accumulated in the facing region 16. When the holes are accumulated, the hole concentration in the second semiconductor layer 12 increases. Thus, the impurity concentration in the facing region 16 becomes high apparently. Thus, the injection amount of the minority carrier from the facing region 16 (i.e., the second semiconductor layer 12) to the first semiconductor layer 11 (i.e., the low concentration layer 14) increases, and therefore, the stationary loss is reduced. As described above, in the semiconductor device 100 according to the present embodiment, the semiconductor device can adjust the stationary loss and the switching loss flexibly by controlling the control signal even after the semiconductor device is manufactured. Here, it is a matter of course that the injection amount of the minority carrier into the first semiconductor layer 11 can be controlled by changing an amplitude of the control signal instead of the polarity of the control signal.

Figure 2:
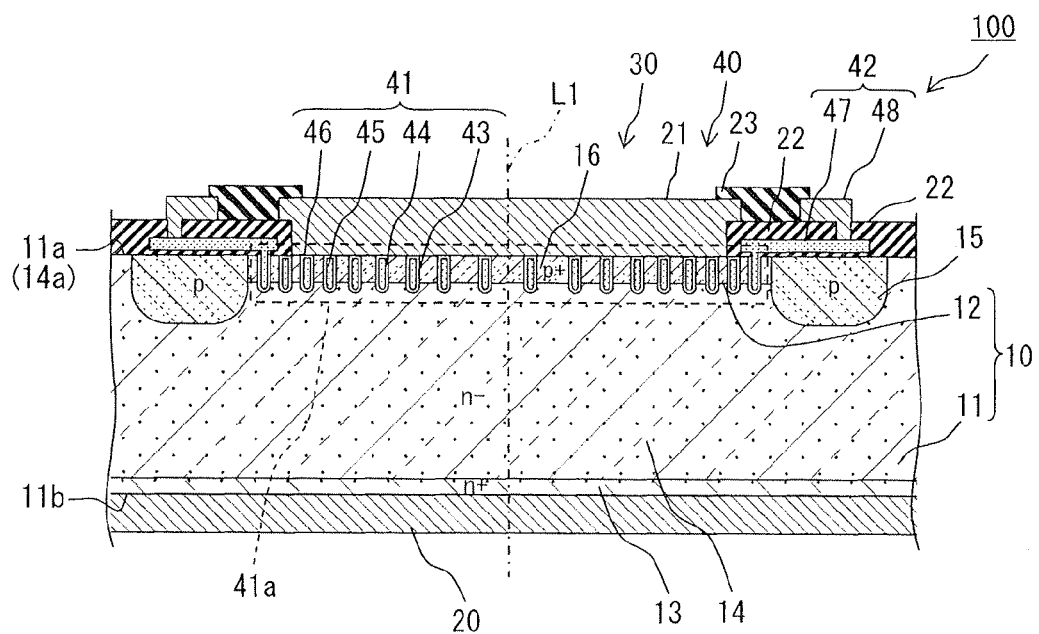
FIG. 2 is a cross sectional view showing a semiconductor device according to a modification of the first embodiment.
Figure 3:
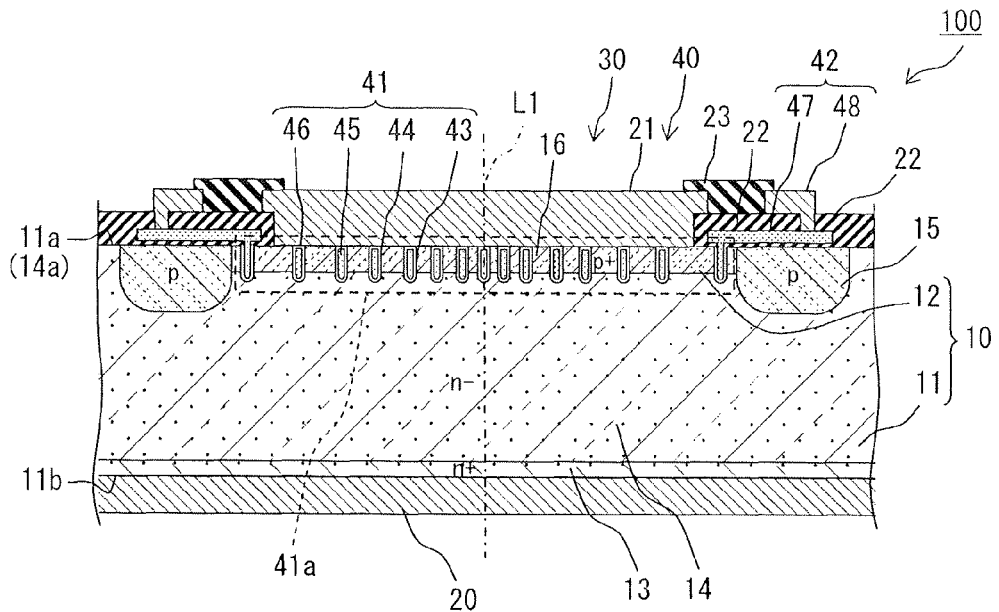
FIG. 3 is a cross sectional view showing a semiconductor device according to a modification of the first embodiment.

In the present embodiment, as shown in FIG. 1, the formation density of the control electrode 41 is homogeneous along with the lateral direction. However, as shown in, for example, FIGS. 2 and 3, the formation density of the control electrode 41 may be inhomogeneous along with the lateral direction. A region surrounded with a broken line in FIGS. 2 and 3 shows a formation region 41a of the control electrode 41. A dashed-dotted line L1 shows a center position of the formation region 41a.

When a forward bias voltage is applied to the diode 30, the minority carrier is injected into the first semiconductor layer 11 (i.e., the low concentration layer 14) so that the forward current flows through the diode 30. When the forward bias voltage is not applied to the diode 30, the carrier injected (i.e., accumulated) into the first semiconductor layer 11 flows into the second semiconductor layer 12. Specifically, a reverse current flows between the electrodes 20, 21. As shown in FIGS. 1 to 3, when the second electrode 21 contacts the insulation film 22, the minority carrier accumulated in a part of the semiconductor layers 11, 12 near the second electrode 21 and the insulation film 22 may concentrate at and flow through a contact portion between the second electrode 21 and the insulation film 22. In this case, the contact portion may be broken. On the other hand, in a modification example in FIG. 2, the formation density of the control electrode becomes high as it goes from the center position to a periphery in the formation region 41a. Specifically, the formation density of the control electrode 41 becomes high as it goes from the center position of the formation region 41 to the contact portion between the second electrode 21 and the insulation film 22. Accordingly, when the positive control signal is input into the control electrode 41, the concentration distribution of the holes accumulated in the first semiconductor layer 11 becomes low as it goes from the center of the formation region 41a to the contact portion between the second electrode 21 and the insulation film 22. Thus, the reverse current amount flowing through the contact portion between the second electrode 21 and the insulation film 22 is reduced, and therefore, the breakdown of the contact portion is restricted.

Further, since the formation density of the trench 43 becomes high as it goes from the center position of the formation region 41a to the periphery, the volume of the second semiconductor layer 12 becomes small as it goes from the center position of the formation region 41a to the periphery. Thus, even when the control signal is not applied, the density distribution of the holes injected into the first semiconductor layer 11 from the second semiconductor layer 12 becomes low as it goes from the center of the formation region 41a to the periphery. Accordingly, even when the control signal is not applied, the reverse current amount flowing through the contact portion between the second electrode 21 and the insulation film 22 is reduced. Thus, the breakdown of the contact portion is restricted.

On the contrary of the modification example in FIG. 2, in the modification example shown in FIG. 3, the formation density of the control electrode 41 becomes low as it goes from the center position of the formation region 41a to the periphery. Thus, when the negative control signal is input into the control electrode 41, the concentration distribution of the accumulated holes becomes low as it goes from the center of the formation region 41a to the periphery. Accordingly, similar to the modification example in FIG. 2, the reverse current amount is reduced, and therefore, the breakdown of the contact portion is restricted.

Here, in the modification example in FIG. 3, as described above, the formation density of the trench 43 becomes low as it goes from the center position of the formation region 41a to the periphery. Thus, the volume of the second semiconductor layer 12 becomes high as it goes from the center position of the formation region 41a to the periphery. Accordingly, in the modification example shown in FIG. 3, when the control signal is not applied, the density distribution of the accumulated holes becomes high as it goes from the center of the formation region 41a to the periphery. Accordingly, in the modification example shown in FIG. 3, which is different from the modification example in FIG. 2, when the control signal is not input, the reverse current amount flowing through the contact portion between the second electrode 21 and the insulation film 22 cannot be reduced. Thus, the effect of a feature in the modification example in FIG. 2 that the hole amount accumulated in a part of the first semiconductor layer 11 near the second electrode 21 and the insulation film 22 is reduced to be smaller than that in the center of the formation region 41a is superior than that in the modification example in FIG. 3. FIGS. 2 and 3 show cross sectional views showing modification examples of the semiconductor device according to the first embodiment.

Figure 4:
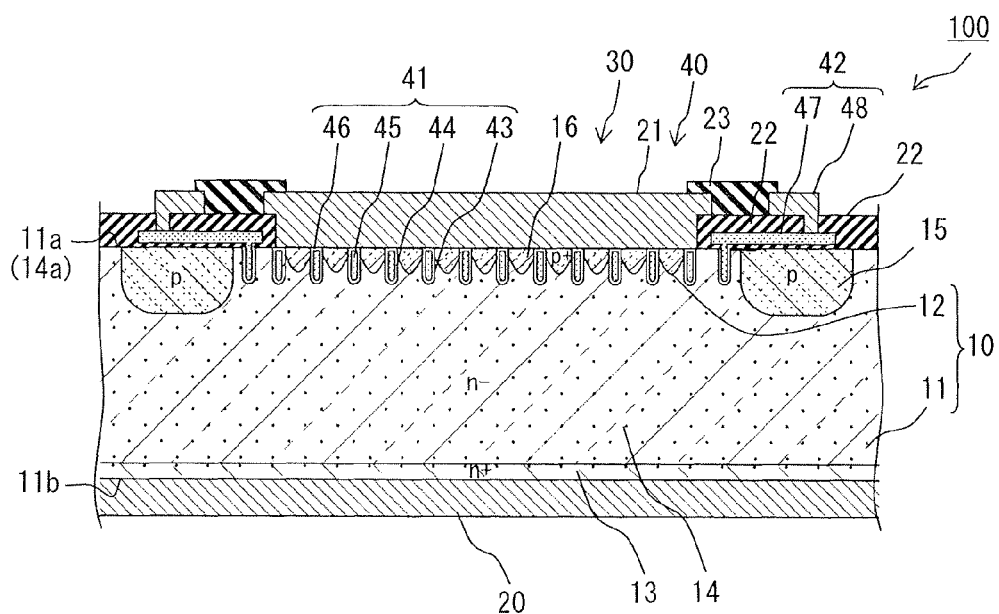
FIG. 4 is a cross sectional view showing a semiconductor device according to a modification of the first embodiment.
Figure 5:
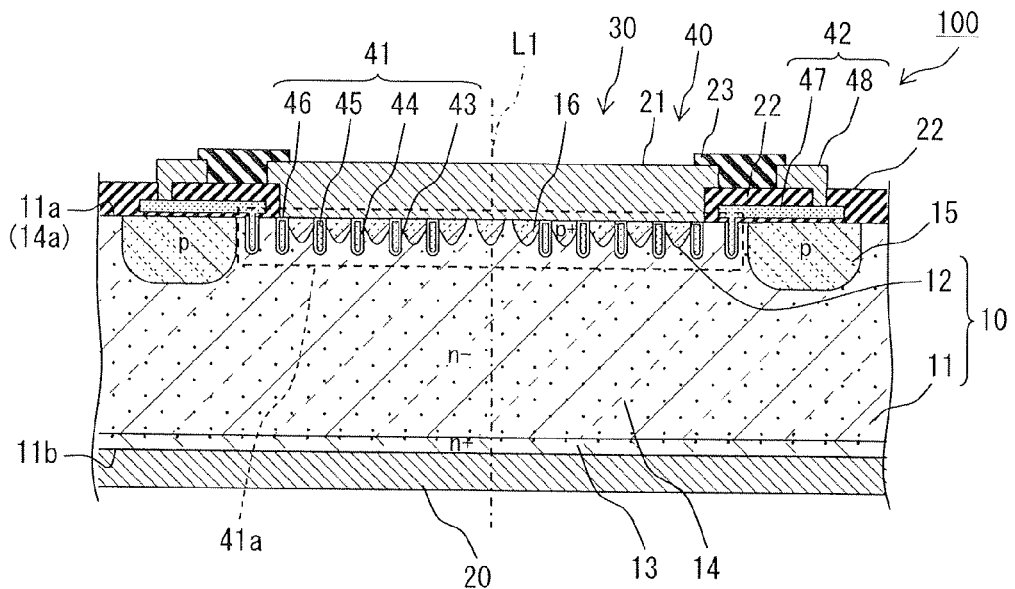
FIG. 5 is a cross sectional view showing a semiconductor device according to a modification of the first embodiment.
Figure 6:
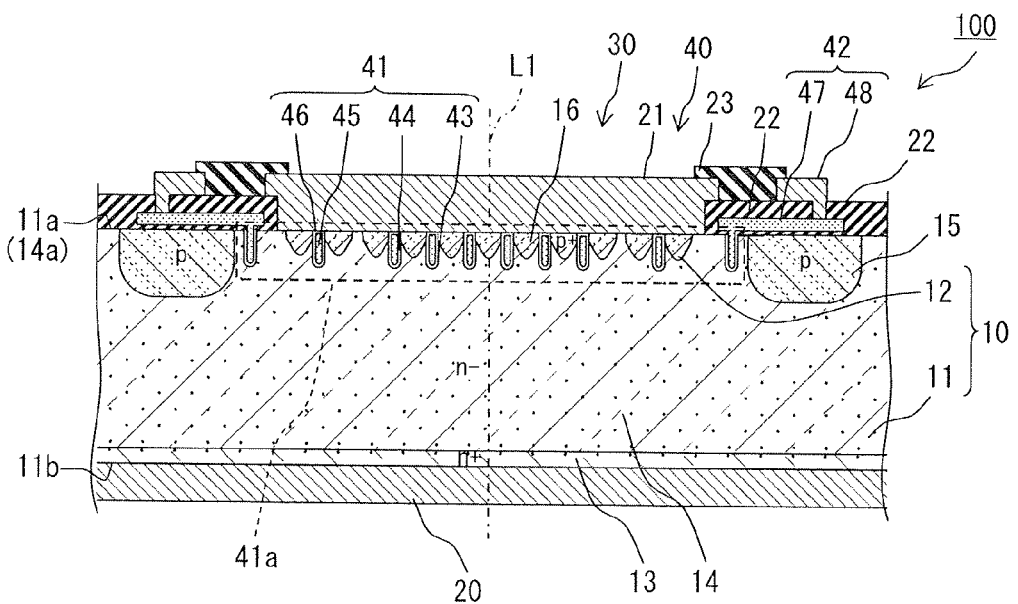
FIG. 6 is a cross sectional view showing a semiconductor device according to a modification of the first embodiment.

In the present embodiment, one second semiconductor layer 12 is formed on the first semiconductor layer 11, and the control electrode 41 is formed in the second semiconductor layer 12. However, as shown in FIGS. 4 to 6, multiple parts of the second semiconductor layers 12 may be formed on the first semiconductor layer 11, and the control electrode 41 may be formed at a region of the first semiconductor layer 11, which is sandwiched between the parts of the second semiconductor layer 12. Here, in FIGS. 5 and 6, an insulation film not shown is formed in a region of the first semiconductor layer 11 on the principal surface 11a, in which the control electrode 41 is not formed. Thus, it is restricted that the first semiconductor layer 11 is directly and electrically coupled with the second electrode 21.

Here, in the semiconductor device 100 shown in FIG. 4, similar to the semiconductor device 100 shown in FIG. 1, the formation density of the control electrode 41 is homogeneous along with the lateral direction. On the other hand, in the semiconductor device 100 shown in FIG. 5, similar to the semiconductor device 100 in FIG. 2, the formation density of the control electrode 41 becomes high as it goes from the center position of the formation region 41a to the periphery. Further, in the semiconductor device 100 shown in FIG. 6, similar to the semiconductor device 100 in FIG. 3, the formation density of the control electrode 41 becomes low as it goes from the center position of the formation region 41a to the periphery. In the semiconductor devices 100 shown in FIGS. 5 and 6, similar to the modification examples in FIGS. 2 and 3, the reverse current amount is reduced, and the breakdown of the contact portion is restricted in the semiconductor device. FIGS. 4 to 6 show cross sectional views showing the modification examples of the semiconductor device according to the first embodiment.

(Second Embodiment)

Figure 7:
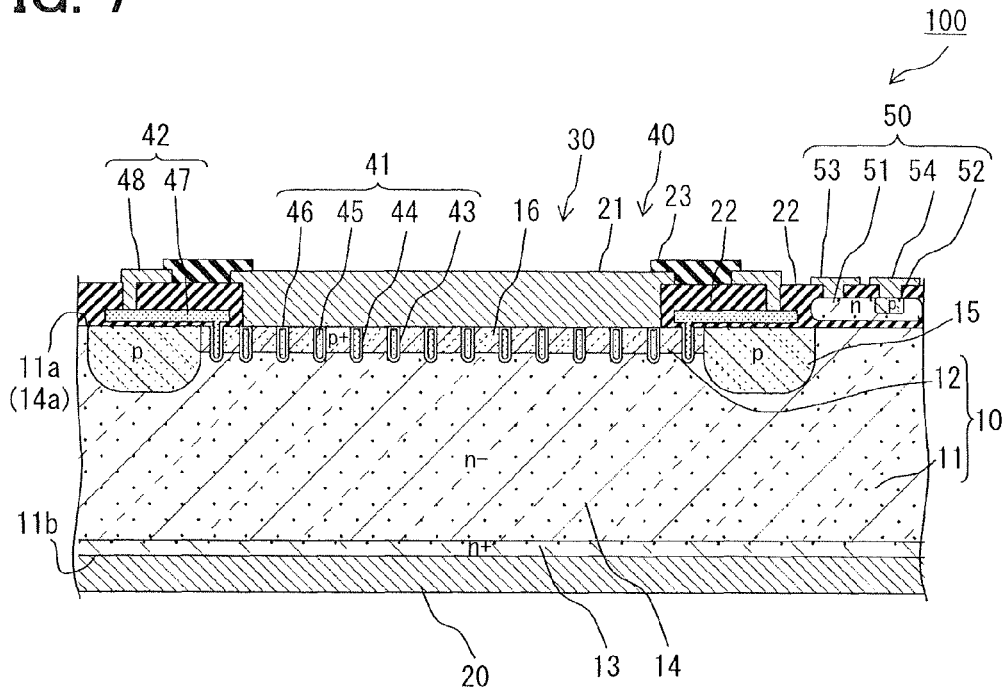
FIG. 7 is a cross sectional view showing a construction of a semiconductor device according to a second embodiment.

Next, a second embodiment of the present invention will be explained with reference to FIG. 7. FIG. 7 is a cross sectional view showing a construction of a semiconductor device according to a second embodiment.

In the semiconductor device according to the second embodiment, many parts are common to the above described embodiments. Thus, the common parts are not explained in detail. Mainly, different parts will be explained. Here, when an element is the same as an element in the above described embodiments, the same reference numeral will be put in the element.

Characteristics of the present embodiment are such that a temperature sensor 50 is formed in the insulation film 22 of the semiconductor device 100 shown in the first embodiment. The temperature sensor 50 detects temperature of the semiconductor substrate 10 (i.e., the diode 30). The temperature sensor 50 according to the present embodiment includes a third semiconductor layer 51 having the N conductive type, a fourth semiconductor layer 52 having the P conductive type and formed in a surface portion of the third semiconductor layer 51, a third electrode 53 formed on a portion of the third semiconductor layer 51 exposed from the insulation film 22, and a fourth electrode 54 formed on a portion of the fourth semiconductor layer 52 exposed from the insulation film 22. Thus, the temperature sensor 50 includes a diode having a PN junction. The sensor 50 functions to measure temperature based on temperature characteristics of a forward direction voltage, which is generated when a forward current flows between the third electrode 53 corresponding to the cathode electrode and the fourth electrode 54 corresponding to the anode electrode. For example, in a case where the semiconductor layers 51, 52 are made of silicon, the temperature characteristics of the forward direction voltage of the temperature sensor 50 is reduced by 2.5 mV when the temperature increases by 1° C. A sensor terminal (not shown) connected to the control circuit (not shown) is coupled with the electrodes 53, 54. The output signal from the temperature sensor 50 is input into the control circuit via the sensor terminal.

The control circuit according to the present embodiment functions to adjust the amplitude and the polarity of the control signal based on the output signal from the temperature sensor 50. The control circuit includes a memory (not shown) for storing the polarity and the amplitude of the control signal corresponding to the temperature, and a ECU (not shown) for retrieving the control signal corresponding to the temperature of the semiconductor substrate 10 detected by the temperature sensor 50 and for outputting the retrieved control signal to the controller 40.

Next, the effects and functions of the semiconductor device 100 according to the present embodiment will be explained. For example, when the semiconductor substrate 10 (i.e., the diode 30) is in a low temperature state, the injection amount of the minority carrier flowing into the first semiconductor layer 11, which provides the diode 30, increases. Therefore, the reverse current increases, and the switching loss increases. On the other hand, when the diode 30 is in a high temperature state, the resistance of the semiconductor substrate increases. Further, since the injection amount of the minority carrier flowing into the second semiconductor layer 12 is reduced, the forward current decreases, and the stationary loss increases. However, the semiconductor device 100 according to the present embodiment includes the temperature sensor 50 for detecting the temperature of the diode 30. The polarity and the amplitude of the control signal to be input into the control electrode 41 is determined according to the temperature of the semiconductor substrate 10 detected by the temperature sensor 50. Accordingly, when the diode 30 is in a low temperature state, the positive control signal is input into the control electrode 41 so that the increase of the switching loss is restricted. On the other hand, when the diode 30 is in a high temperature state, the negative control signal is input into the control electrode 41 so that the increase of the stationary loss is restricted. It is a matter of course that the injection amount of the minority carrier into the second semiconductor layer 12 can be controlled by changing an amplitude of the control signal instead of the polarity of the control signal.

(Third Embodiment)

Figure 8:
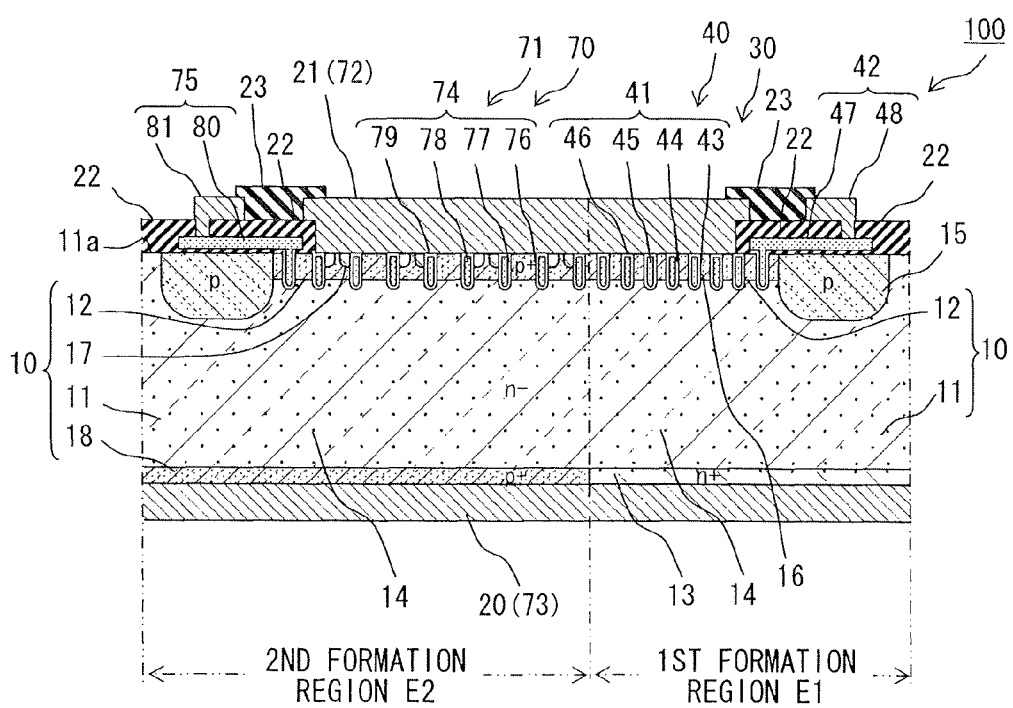
FIG. 8 is a cross sectional view showing a construction of a semiconductor device according to a third embodiment.
Figure 9:
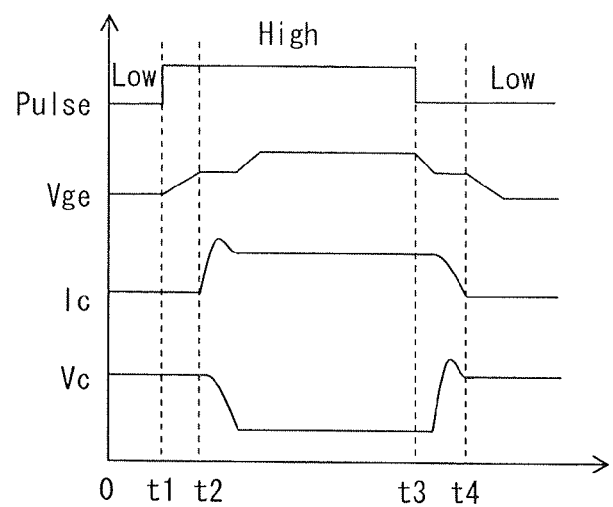
FIG. 9 is a timing chart showing an on state and a off state of an IGBT.

Next, a third embodiment of the present invention will be explained with reference to FIGS. 8 and 9. FIG. 8 is a cross sectional view showing a construction of a semiconductor device according to a third embodiment. FIG. 9 is a timing chart explaining an on state and an off state of an IGBT.

In the semiconductor device according to the third embodiment, many parts are common to the above described embodiments. Thus, the common parts are not explained in detail. Mainly, different parts will be explained. Here, when an element is the same as an element in the above described embodiments, the same reference numeral will be put in the element.

In the first embodiment, the diode 30 is formed in the semiconductor substrate 10. On the other hand, as shown in FIG. 8, the present embodiment has characteristics such that the diode 30 and an IGBT 70 are formed in the semiconductor substrate 10.

As shown with a dashed two-dotted line in FIG. 8, the semiconductor substrate 10 according to the present embodiment is divided to a first formation region E in which the diode 30 is formed and a second formation region E2 in which the IGBT 70 is formed. The construction of the first formation region E1 is the same as the construction described in the first embodiment. Thus, the construction of the second formation region E2 will be explained.

The semiconductor substrate 10 in the second formation region E2 includes a fifth semiconductor layer 17 having the N conductive type and a sixth semiconductor layer 18 having the P conductive type in addition to the first semiconductor layer 11 and the second semiconductor layer 12. The first semiconductor layer 11 in the second formation region E2 only includes the low concentration layer 14, that is different from the first semiconductor layer 11 in the first formation region E1. Multiple parts of the fifth semiconductor layers 17 are formed in a surface portion of the second semiconductor layer 12. The sixth semiconductor layer 18 is formed on a surface of the low concentration layer 14 opposite to a surface, on which the second semiconductor layer 12 is formed. The fifth semiconductor layer 17 contacts the second electrode 21. The sixth semiconductor layer 18 contacts the first electrode 20.

The IGBT 70 includes a gate electrode 71, an emitter electrode 72 and a collector electrode 73. The gate electrode 71 functions to control the polarity of the second semiconductor layer 12 disposed between the fifth semiconductor layer 17 and the first semiconductor layer 11 along with the thickness direction. The emitter electrode 72 corresponds to the second electrode 21, and the collector electrode 73 corresponds to the first electrode 20.

The gate electrode 71 includes a trench electrode 74 having the same construction as the control electrode 41 described in the first embodiment and a driving pad 75 having the same construction as the control pad 42 described in the first embodiment. The trench electrode 74 includes a trench 76, a first insulation film 77, a conductive member 78 and a second insulation film 79. The trench 76 is formed on the second semiconductor layer 12 such that a top of the trench 76 protrudes from the principal surface 11a to the low concentration layer 14. The first insulation film 77 is formed on an inner wall of the trench 76. The conductive member 78 fills in a concavity provided by the first insulation film 77. The second insulation film 79 seals a part of an opening of the concavity. As shown in FIG. 8, the trenches 76 are formed to be arranged in parallel to each other along with the lateral direction. Further, the trenches 76 extends in the depth direction to form a stripe pattern with respect to a plane, which is provided by the depth direction and the lateral direction. The conductive member 78 is covered with the insulation films 77, 79 so that the member 78 is insulated from the second electrode 21 and the semiconductor layers 11, 12. Each conductive member 78 (i.e., the control electrode 41 formed in parallel to each other along with the lateral direction is covered with the insulation films 77, 79. Each member 78 is electrically coupled with the connection electrode (not shown), which extends along with the lateral direction.

The driving pad 75 includes a retrieved electrode 80 formed on the well region 15 on the principal surface 11a of the first semiconductor layer 11 and a fifth electrode 81 electrically coupled with the retrieved electrode 80. As shown in FIG. 1, the retrieved electrode 80 is electrically coupled with the conductive member 78. The retrieved electrode 80 is covered with the insulation films 22, 79. A portion of the retrieved electrode 80 exposed from the insulation films 22, 79 is electrically coupled with the fifth electrode 81. The fifth electrode 81 is sealed by and protected with the protection film 23. A portion of the fifth electrode 81 exposed from the protection film 23 is coupled with a terminal for connecting to a generating unit (not shown), which generates the driving signal. The driving signal is a pulse, a voltage level of which is changed at predetermined intervals. Here, the generating unit corresponds to a driving signal generating unit.

Next, the driving operation of the IGBT 70 will be explained with reference to FIG. 9. A lateral axis in FIG. 9 represents time, and a vertical axis represents an arbitrary unit. Pulse in FIG. 9 represents the driving signal, Vge represents a gate-emitter voltage, Ic represents collector current, and Vc represents collector voltage. t1 represents a time when the voltage level of the driving signal is switched from a low level to a high level. t2 represents a time when a channel is formed in the IGBT 70. t3 represents a time when the voltage level of the driving signal is switched from the high level to the low level. t4 represents a time when the channel is disappeared.

An operation of the IGBT 70 that the off state is switched to the on state will be explained. When predetermined voltages are applied to the collector electrode 73 (i.e., the first electrode 20) and the emitter electrode 72 (i.e., the second electrode 21), respectively, and the driving signal of the high level is input into the gate electrode 71 from the generating unit, the polarity of the second semiconductor layer 12 adjacent to the gate electrode 71 is reversed, and the channel for connecting between the fifth semiconductor layer 17 and the first semiconductor layer 11 is formed. When the electrons are injected from the fifth semiconductor layer 17 to the first semiconductor layer 11 (i.e., the low concentration layer 14), a forward bias voltage is applied to a connection (i.e., the PN junction) between the sixth semiconductor layer 18 and the first semiconductor layer 11. Thus, the holes are injected from the sixth semiconductor layer 18 to the first semiconductor layer 11. When the electrons and holes are accumulated in the first semiconductor layer 11, conductivity of the first semiconductor layer 11 is changed. Thus, current (i.e., collector current) flows between the electrodes 72, 73.

Next, an operation of the IGBT 70 that the on state is switched to the off state will be explained. Under a condition that the collector current flows, when the driving signal input turns off, and the channel is disappeared in the second semiconductor layer 12, the injection of the electrons from the fifth semiconductor layer 17 to the first semiconductor layer 11 starts. At the same time, the injection of the holes from the sixth semiconductor layer 18 to the first semiconductor layer 11 stops. The electrons and holes accumulated in the first semiconductor layer 11 are re-combined with each other, or flow into the electrodes 72, 73, respectively, so that the electrons and holes are discharged to the outside.

Next, the effects and functions of the semiconductor device 100 according to the present embodiment will be explained. As described above, when the IGBT 70 and the diode 30 are formed in one semiconductor substrate 10, the following difficulties may arise. For example, when the IGBT 70 is in an off state, and the reverse current flows through the diode 30, a part of the reverse current may flow into the IGBT 70, and therefore, the IGBT 70 mal-functions. However, in the semiconductor device 100 according to the present embodiment, the controller 40 is formed in the first formation region E1. Accordingly, when the IGBT 70 is in an off state, and the current flowing through the diode 30 is switched from the forward current to the reverse current, the positive control signal is input into the control electrode 41. Thus, the accumulation amount of the minority carrier accumulated in the first semiconductor layer 11 is reduced, and the reverse current amount is reduced. Thus, the reverse current amount flowing into the IGBT 70 is reduced, and therefore, the malfunction of the IGBT 70 is restricted.

Further, when the IGBT 70 and the diode 30 are formed in the same semiconductor substrate 10, the impurity concentrations of the semiconductor layers 11, 12 for providing the IGBT 70 and the diode 30 are determined to be adapted to the IGBT 70, in general. Accordingly, in the construction according to the present embodiment, a problem may arise that the impurity concentrations of the semiconductor layers 11, 12 are not determined to be adapted to the diode 30. However, the semiconductor device 100 according to the present embodiment includes the controller 40. Accordingly, the control signal to be input into the control electrode 41 is controlled so that the impurity concentration of the second semiconductor layer 12 is apparently adjusted to be adapted to the diode 30. For example, when the positive control signal is applied to the control electrode 41, the impurity concentration of the second semiconductor layer 12 is apparently reduced. When the negative control signal is applied to the control electrode 41, the impurity concentration of the second semiconductor layer 12 is apparently increased. It is a matter of course that the impurity concentration of the second semiconductor layer 12 is apparently and continuously changed by controlling the amplitude of the control signal continuously instead of the polarity of the control signal.

In the present embodiment, the trench electrode 74 having the same construction as the control electrode 41 is formed in the second formation region E2. In this case, the control electrode 41 as an element of the controller 40 and the trench electrode 74 as an element of the IGBT 70 are formed I the same process. Thus, the manufacturing process of the semiconductor device 100 is simplified, and the manufacturing cost is reduced, compared with a case where the control electrode 41 has a construction different from a construction of the trench electrode 74.

In the present embodiment, the driving pad 75 having the same construction as the control pad 42 is formed in the second formation region E2. Thus, the control pad 42 as an element of the controller 40 and the driving pad 75 as an element of the IGBT 70 can be formed in the same process. Thus, the manufacturing process of the semiconductor device 100 is simplified, and the manufacturing cost is reduced, compared with a case where the control pad 42 has a construction different from a construction of the driving pad 75.

Figure 10:
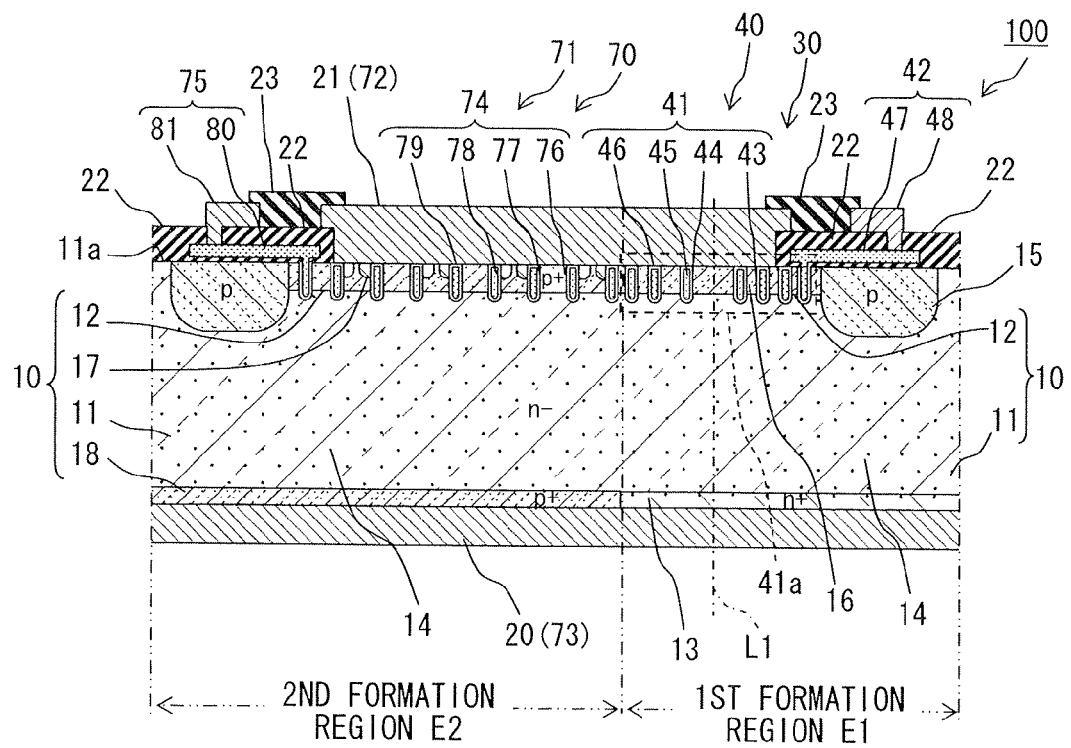
FIG. 10 is a cross sectional view showing a semiconductor device according to a modification of the third embodiment.
Figures 11, 12:
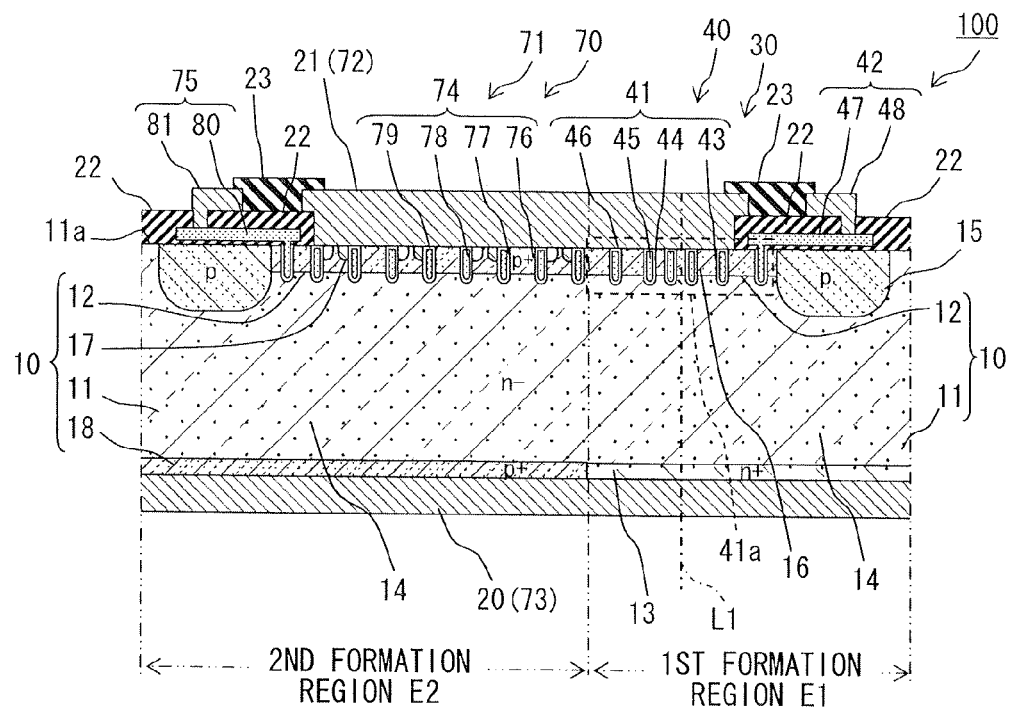
FIG. 11 is a cross sectional view showing a semiconductor device according to a modification of the third embodiment.
FIG. 12 is a circuit diagram showing the semiconductor device according to the third embodiment.

In the semiconductor device 100 shown in FIG. 8, similar to the semiconductor devices 100 shown in FIGS. 1 and 4, the formation density of the control electrode 41 is homogeneous along with the lateral direction. On the other hand, the semiconductor device 100 shown in FIG. 10, similar to the semiconductor devices 100 shown in FIGS. 2 and 5, the formation density of the control electrode 41 becomes high as it goes from the center position to the periphery of the formation region 41a. Further, the semiconductor device 100 shown in FIG. 11, similar to the semiconductor devices 100 shown in FIGS. 3 and 6, the formation density of the control electrode 41 becomes low as it goes from the center position to the periphery of the formation region 41a. Thus, the semiconductor devices shown in FIGS. 10 and 11, similar to the modification examples in FIGS. 2-3 and 5-6, the reverse current amount is reduced, and the breakdown of the contact portion is restricted in the semiconductor device. FIGS. 10 and 11 are cross sectional views showing modification examples of the semiconductor device according to the third embodiment.

(Fourth Embodiment)

Figure 13:
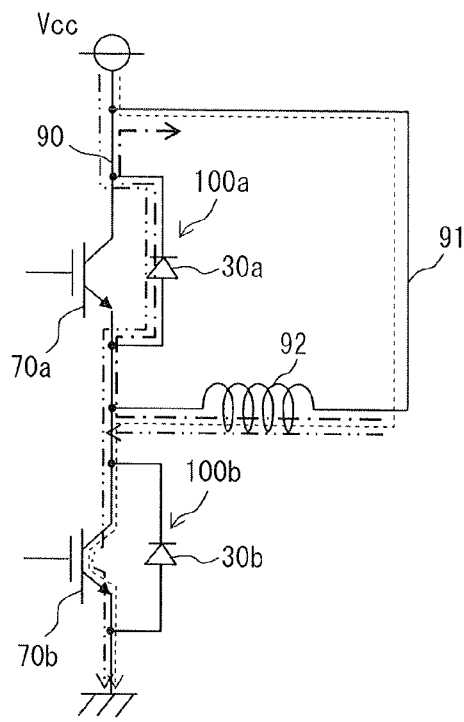
FIG. 13 is a diagram showing a state such that current flows through an induction type load by using energy accumulated in the induction type load from a right side to a left side of the drawing.
Figure 14:
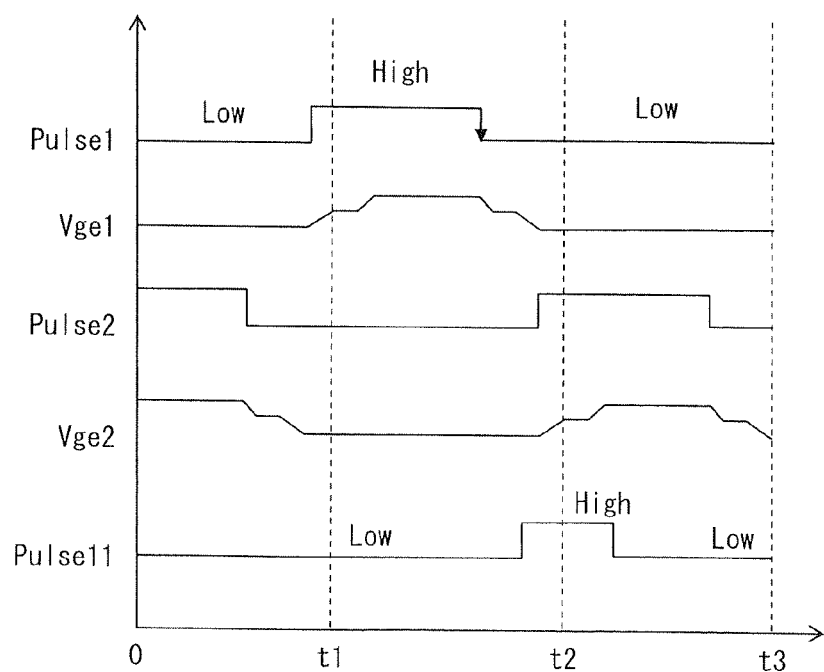
FIG. 14 is a timing chart showing a control signal applied to the first diode.
Figure 15:
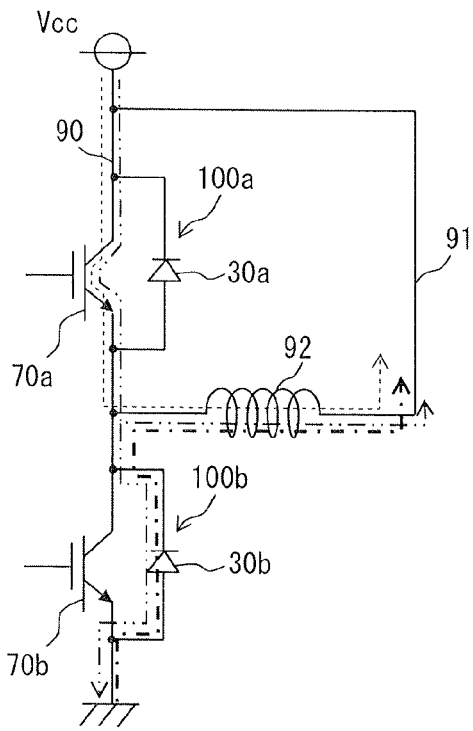
FIG. 15 is a diagram showing a state such that current flows through an induction type load by using energy accumulated in the induction type load from a left side to a right side of the drawing.
Figure 16:
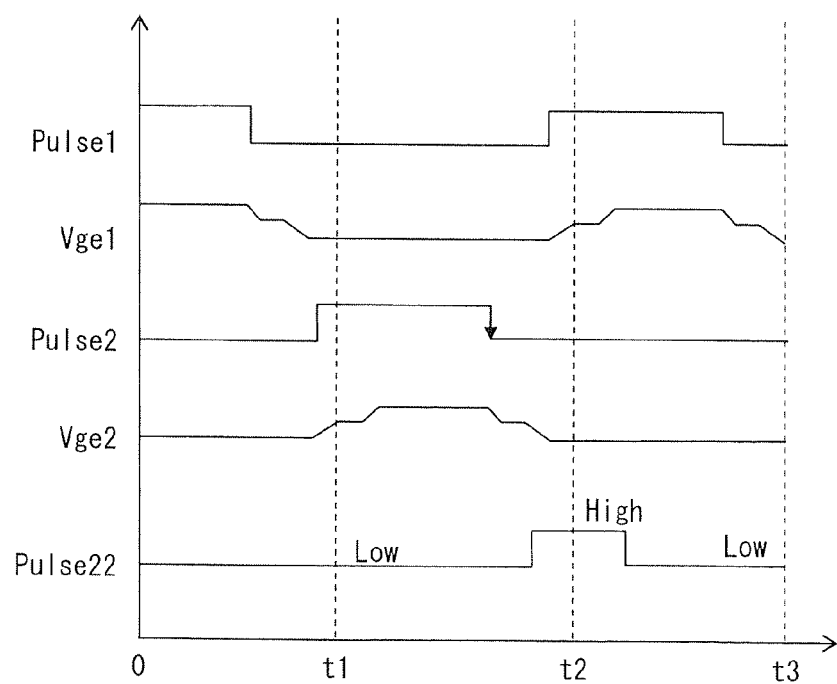
FIG. 16 is a timing chart showing a control signal applied to the second diode.

Next, a fourth embodiment of the present invention will be explained with reference to FIGS. 12-16. FIG. 12 is a circuit diagram showing a semiconductor device according to a third embodiment. FIG. 13 is a diagram showing a state such that current flows through an induction type load by using energy accumulated in the induction type load in the circuit shown in FIG. 12 from a right side to a left side of the drawing. FIG. 14 is a timing chart showing a control signal applied to a first diode. FIG. 15 is a diagram showing a state such that current flows through an induction type load in the circuit shown in FIG. 12 by using energy accumulated in the induction type load from a left side to a right side of the drawing. FIG. 16 is a timing chart showing a control signal applied to a second diode.

The semiconductor device according to the fourth embodiment is the same as the semiconductor device according to the third embodiment. The explanation relating to the semiconductor device will not be performed. Here, when an element is the same as an element in the above described embodiments, the same reference numeral will be put in the element.

In the present embodiment, as shown in FIG. 12, two semiconductor devices 100a, 100b shown in the third embodiment provide a half bridge circuit as one of inverter circuits for converting a direct current signal to an alternating current signal. The semiconductor device 100a includes a ITGBT 70a and a diode 30a. The semiconductor device 100b includes an IGBT 70b and a diode 30b. To distinguish each element, the IGBT 70a is defined as the first IGBT 70a, the IGBT 70b is defined as the second IGBT 70b, the diode 30a is defined as the first diode 30a, and the diode 30b is defined as the second diode 30b.

In the half bridge circuit shown in FIG. 12, a first wiring 90 for connecting between the power source Vcc and the ground is coupled in series with two IGBTs 70a, 70b. The first IGBT 70a and the first diode 30a are coupled reversely in parallel to each other, and the second IGBT 70b and the second diode 30b are coupled reversely in parallel to each other. The second wiring 91 is coupled between a portion of the first wiring 90 for connecting between the power source Vcc and the first IGBT 70a and a portion (i.e., mutual connection point) of the first wiring 91 for connecting between the first IGBT 70a and the second IGBT 70b. The induction type load 92 is formed on the second wiring 91. Connection among the IGBTs 70a, 70b and the diodes 30a, 30b are expressed in a different manner such that the first IGBT 70a and the second diode 30b are coupled in series between the power source Vcc and the ground, and the first diode 30a and the second IGBT 70b are coupled in series between the power source Vcc and the ground.

The control signal to be applied to each diode 30a, 30b will be explained with reference to FIGS. 13-16. Here, the lateral axis in FIGS. 14 and 16 represents time, and the vertical axis represents an arbitrary unit. In FIGS. 14 and 16, Pulse 1 represents the driving signal to be input into the first IGBT 70a, Vge 1 represents a gate-emitter voltage of the first IGBT 70a, Pulse 2 represents the driving signal to be input into the second IGBT 70a, Vge 2 represents a gate-emitter voltage of the second IGBT 70b, Pulse 11 represents the control signal to be input into the first diode 30a, and Pulse 22 represents the driving signal to be input into the second diode 30b. In FIGS. 14 and 16, a time interval between zero and t1 represents a time period in which the current shown as a broken line in FIGS. 13 and 15 flows. A time interval between t1 and t2 represents a time period in which the current shown as a dashed dotted line in FIGS. 13 and 15 flows. A time interval between t2 and t3 represents a time period in which the current shown as a dashed two-dotted line in FIGS. 13 and 15 flows.

Firstly, the control signal to be applied to the first diode 30a will be explained with reference to FIGS. 13 and 14. When the first IGBT 70a is in an off state, and the second IGBT 70b is in an on state, the current shown as the broken line flows in the induction type load 92. Specifically, the current flows from the power source to the ground via the induction type load 92 and the second IGBT 70b. In this case, the current does not flow in the first diode 30a. When the current does not flow in the first diode 30a, no power loss is generated in the first diode 30a. Thus, it is not necessary to input the control signal into the first diode 30a. However, in the present embodiment, the control signal having the low level is input.

Under a condition that the current shown as the broken line flows in the induction type load 92, when the second IGBT 70b switches from the on state to the off state, and the first IGBT 70a switches from the off state to the on state, the current shown as the dashed dotted line flows in the induction type load 92 by using energy accumulated in the induction type load 92. Specifically, the current flows from the induction type load 92 to the first diode 30a. In this case, the forward current flows in the first diode 30a. When the forward current flows in the first diode 30a, the stationary loss is generated in the first diode 30a. In the present embodiment, while the current shown as the dashed dotted line flows, the control signal having the low level is input into the control electrode 41 of the first diode 30a. Thus, the stationary loss in the first diode 30a is reduced.

Under a condition that the current shown as the dashed dotted line flows in the induction type load 92, when the first IGBT 70a switches from the on state to the off state, and the second IGBT 70b switches from the off state to the on state, the current shown as the dashed two-dotted line flows in the induction type load 92 by using energy accumulated in the induction type load 92. Specifically, the current flows from power source to the ground via the induction type load 92 and the second IGBT 70b, and further, the current flows from the power source to the ground via the first diode 30a and the second IGBT 70b. In this case, the reverse current flows in the first diode 30a, and further, the surge voltage is applied at the time t2. When the reverse current flows in the first diode 30a, and further, the surge voltage is applied, the switching loss is generated. In the present embodiment, as shown in FIG. 14, the control signal having the high level is input into the control electrode 41 of the first diode 30a before and after the time t2 when the reverse current flows in the first diode 30a, and the surge voltage is generated. Thus, the switching loss in the first diode 30a is reduced. The current flowing from the power source to the ground via the first diode 30a and the second IGBT 70b disappears after a predetermined time elapses. In the present embodiment, the control signal having the high level is input into the first diode 30a until the above described current disappears. Specifically, the control signal having the high level is input into the first diode 30a until the reverse current flowing through the first diode 30a disappears and the surge voltage disappears.

Next, the control signal to be applied to the second diode 30b will be explained with reference to FIGS. 15 and 16. When the first IGBT 70a is in a on state, and the second IGBT 70b is an off state, the current shown as the broken line flows in the induction type load 92. Specifically, the current flows from the power source Vcc to the induction type load 92 via the first IGBT 70a. In this case, the current does not flow in the second diode 30b. When the current does not flow in the second diode 30b, the power loss is not generated in the second diode 30b. Thus, it is not necessary to input the control signal into the second diode 30b. However, in the present embodiment, the control signal having the low level is input.

Under a condition that the current shown as the broken line flows in the induction type load 92, when the first IGBT 70a switches from the on state to the off state, and the second IGBT 70b switches from the off state to the on state, the current shown as the dashed dotted line flows in the induction type load 92 by using energy accumulated in the induction type load 92. Specifically, the current flows from the ground to the induction type load 92 via the second diode 90b. In this case, the forward current flows in the second diode 30b. When the forward current flows in the second diode 30b, the stationary loss is generated in the second diode 30b. In the present embodiment, while the current shown as the dashed dotted line flows, the control signal having the low level is input into the control electrode 41 of the second diode 30b. Thus, the stationary loss in the second diode 30b is reduced.

Under a condition that the current shown as the dashed dotted line flows in the induction type load 92, when the first IGBT 70a switches from the off state to the on state, and the second IGBT 70b switches from the on state to the off state, the current shown as the dashed two-dotted line flows in the induction type load 92 by using energy accumulated in the induction type load 92. Specifically, the current flows from the power source to the induction type load 92 via the first IGBT 70a, and the current flows from the power source to the ground via the first IGBT 70a and the second diode 30b. In this case, the reverse current flows in the second diode 30b, and further, the surge voltage in proportion to the time variation of the reverse current is applied at the time t2. When the reverse current flows in the second diode 30b, and further, the surge voltage is applied, the switching loss is generated. In the present embodiment, as shown in FIG. 16, the control signal having the high level is input into the control electrode 41 of the second diode 30b before and after the time t2 when the reverse current flows in the second diode 30b, and the surge voltage is generated. Thus, the switching loss in the second diode 30b is reduced. The current flowing from the power source to the ground via the first IGBT 70a and the second diode 30b disappears after a predetermined time elapses. In the present embodiment, the control signal having the high level is input into the second diode 30b until the above described current disappears. Specifically, the control signal having the high level is input into the second diode 30b until the reverse current flowing through the second diode 30b disappears and the surge voltage disappears.

Here, the timing for applying the control signal having a predetermined voltage level, which is adapted to the control electrode 41 of each diode 30a, 30b, is determined according to the driving signal to be input into each IGBT 70a, 70b. As shown in FIG. 14, the time when the control signal having the high level is input into the control electrode 41 of the first diode 30a is in a transition period when the first IGBT 70a switches from the on state to the off state, and the second IGBT 70b switches from the off state to the on state. In other words, the time is after the driving signal to be input into the first IGBT 70a is switched from the high level to the low level, and before the driving signal to be input into the second IGBT 70b is switched from the low level to the high level. Accordingly, the timing for inputting the control signal having the high level into the control electrode 41 of the first diode 30a is determined according to the timing for falling the driving signal to be applied to the first IGBT 70a from the high level to the low level. Further, as shown in FIG. 16, the time when the control signal having the high level is input into the control electrode 41 of the second diode 30b is after the driving signal to be input into the first IGBT 70a is switched from the high level to the low level, and before the driving signal to be input into the second IGBT 70b is switched from the low level to the high level. Accordingly, the timing for inputting the control signal having the high level into the second diode 30b is determined according to the timing for falling the driving signal to be applied to the second IGBT 70b from the high level to the low level.

The control circuit according to the present embodiment functions when the voltage level of the driving signal is changed from the high level to the low level. The circuit includes a reverse unit (not shown) for reversing the voltage level of the driving signal of each IGBT 70a, 70b, a delaying unit (not shown) for delaying the output signal of the reverse unit by a predetermined time, and a pulse width adjusting unit (not shown) for outputting the output signal of the delaying unit during a predetermined time.

The effects and functions of the semiconductor device 100 according to the present embodiment will be explained. The stationary loss is generated when the forward current flows in the diode 30. The stationary loss is reduced when the injection amount of the minority carrier into the first semiconductor layer 11 becomes large. The switching loss is generated when the reverse current flows in the diode 30. The switching loss is reduced when the injection amount (i.e., the accumulation amount) of the minority carrier into the first semiconductor layer 11 becomes small. Further, the injection amount of the minority carrier into the first semiconductor layer 11 increases when the negative control signal is input into the control electrode 41. When the positive control signal is input into the control electrode 41, the injection amount decreases. However, in the present embodiment, the negative control signal is input into the control electrode 41 when the forward current flows in the diode 30a, 30b. The positive control signal is input into the control electrode 41 just before the reverse current flows in the diode 30a, 30b. Thus, the injection amount of the minority carrier increases when the forward current flows. Further, the accumulation amount of the minority carrier accumulated in the first semiconductor layer 11 is reduced just before the reverse current flows. Thus, both of the stationary loss and the switching loss are reduced.

Here, for example, when the frequency of the driving signal is higher than a predetermined value, and the open/close frequency in each IGBT 70a, 70b is high in the half bridge circuit shown in FIG. 12, the number of occurrences that the reverse current flows in each diode 30a, 30b increases. Thus, a ration between the switching loss with respect to the power loss in the diode 30a, 30b becomes higher than a ratio between the stationary loss with respect to the power loss. On the other hand, when the frequency of the driving signal is lower than a predetermined value, and the open/close frequency in each IGBT 70a, 70b is low, the number of occurrences that the reverse current flows in each diode 30a, 30b decreases. Thus, a ration between the stationary loss with respect to the power loss in the diode 30a, 30b becomes higher than a ratio between the switching loss with respect to the power loss. Accordingly, when the frequency of the driving signal is higher than the predetermined value, the positive control signal is always input into the control electrode 41. Thus, the increase of the switching loss, which has a ratio with respect to the power loss higher than the stationary loss, is restricted, so that the increase of the power loss is restricted. When the frequency of the driving signal is lower than the predetermined value, the negative control signal is always input into the control electrode 41. Thus, the increase of the stationary loss, which has a ratio with respect to the power loss higher than the switching loss, is restricted, so that the increase of the power loss is restricted. Here, the above described predetermined value represents a case where the ratio of the switching loss with respect to the power loss is equal to the ratio of the stationary loss with respect to the power loss. In this case, the control circuit includes a determination unit for determining whether the frequency of the driving signal is higher or lower than the predetermined value.

The preferred embodiments of the present invention have been explained. The present invention is not limited to the above described embodiments. Various modifications can be applied within a scope of the present invention.

In each embodiment, the trench 43 extends along with the depth direction to form the stripe pattern with respect to the plane provided by the depth direction and the lateral direction. However, the shape of the trench 43 with respect to the plane provided by the depth direction and the lateral direction is not limited to the above example. For example, multiple ring shaped trench 43 may be arranged in a mesh manner. Alternatively, multiple ring shaped trench 43 having a center around the center position of the formation region 41a of the control electrode 41 may be arranged in a nested structure.

In each embodiment, the control electrode 41 is a trench type. However, the shape of the control electrode 41 is not limited to the above example. For example, the control electrode 41 may be a planar type.

In the second embodiment, the temperature sensor 50 detects temperature based on the temperature characteristics of the forward direction voltage of the PN junction. However, the temperature sensor 50 si not limited to the above example. For example, the temperature sensor 50 may be a thermistor or the like.

In the third embodiment, the IGBT 70 is formed in the semiconductor substrate 10. However, a switching element being controlled to open and close by the driving signal is not limited to the IGBT 70. For example, the switching element may be a MOSFET. In this case, the sixth semiconductor layer 18 shown in FIGS. 8, 11 and 12 has the N conductive type.

In the fourth embodiment, a circuit for controlling the operation of the half bridge provided by two semiconductor devices 100a, 100b is not shown in the drawings. However, the circuit for controlling the operation of the half bridge circuit according to the fourth embodiment may be a control circuit 60 shown in FIG. 17, for example.

Figure 17:
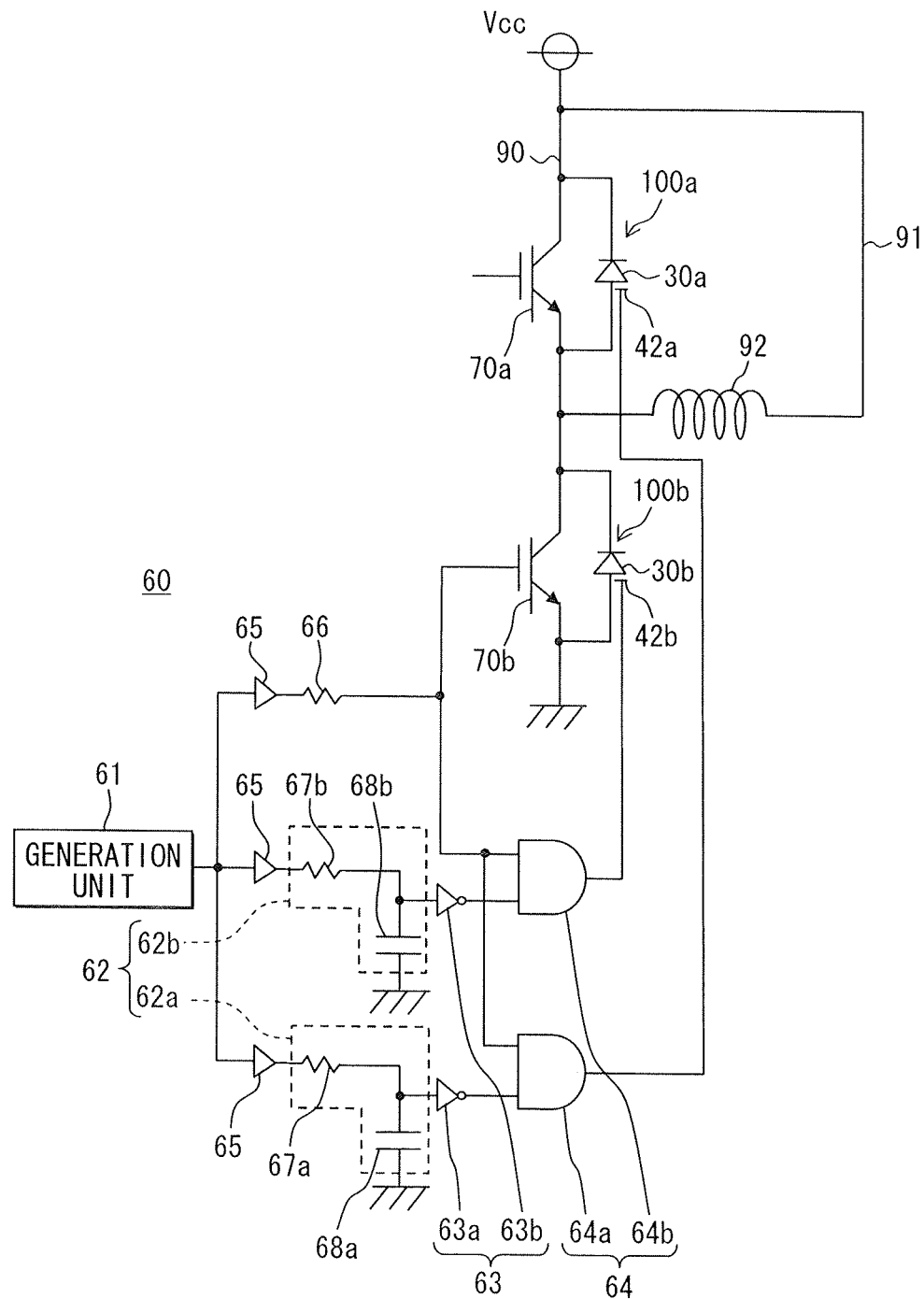
FIG. 17 is a circuit diagram showing a control circuit.
Figure 18:
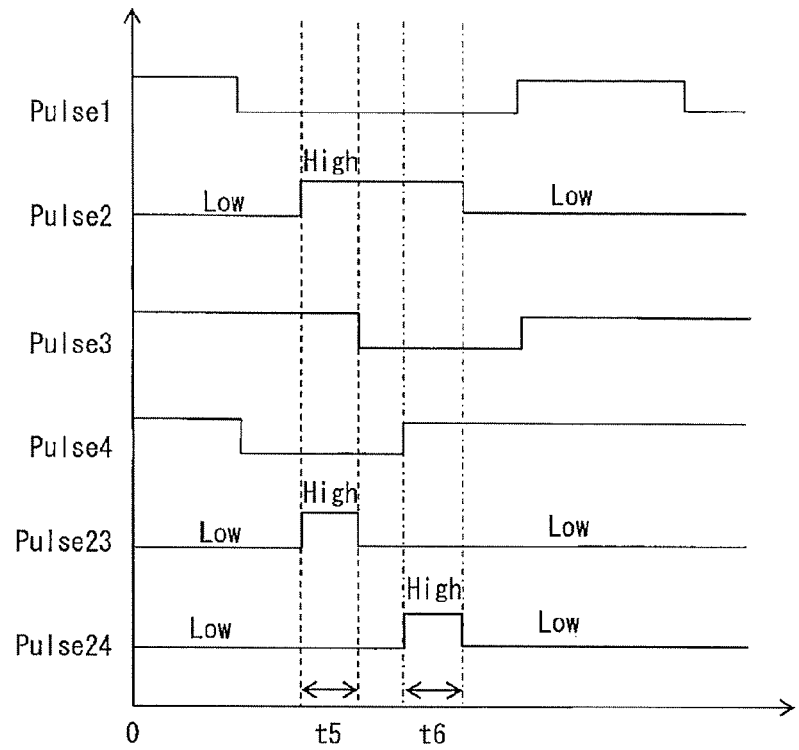
FIG. 18 is a timing chart showing the control signal flowing through the control circuit.
Figure 19:
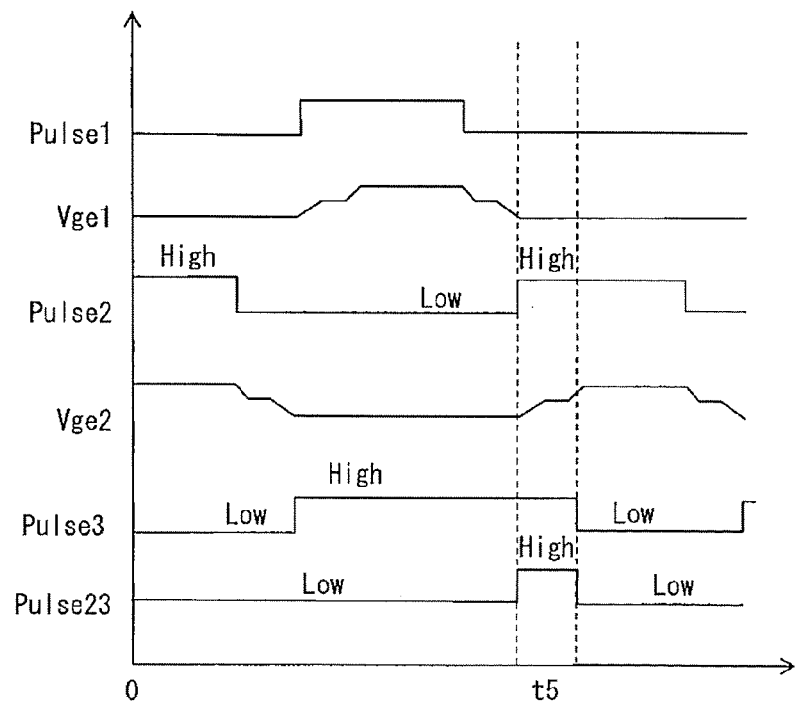
FIG. 19 is a timing chart showing the control signal applied to the first diode.
Figure 20:
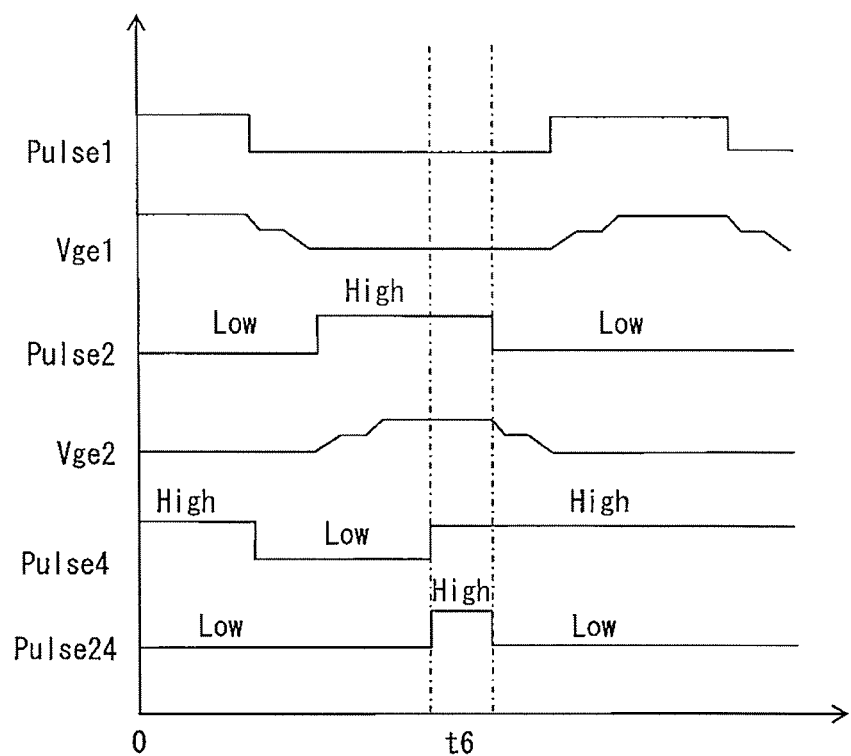
FIG. 20 is a timing chart showing the control signal applied to the second diode.

The construction and operation of the control circuit 60 will be explained with reference to FIGS. 17 to 20. FIG. 17 is a circuit diagram showing the control circuit. FIG. 18 is a timing chart showing a control signal flowing through the control circuit. FIG. 19 is a timing chart showing a control signal applied to the first diode. FIG. 20 is a timing chart showing a control signal applied to the second diode.

In FIG. 17, the control pad of the first diode 30a is shown as a horizontal bar and a reference numeral 42a. The control pad of the second diode 30b is shown as a horizontal bar and a reference numeral 42b. Further, to simplify the explanation, the generation unit for inputting the driving signal into the first IGBT 70a is not shown in FIG. 17.

The control circuit 60 includes a generation unit 61, a timing adjusting unit 62, a NOT gate 63, and an AND gate 64. The generation unit 61 generates the driving signal having a pulse shape, and the voltage level of the driving signal is switched at predetermined periods. The timing adjusting unit 62 delays or advances the driving signal by a predetermined time. The NOT gate reverses the polarity of the driving signal, the timing of which is adjusted by the timing adjusting unit 62. The driving signal and the output signal from the NOT gate 63 are input into the AND gate 64. The output signal from the AND gate 64 provides the control signal, which is input into the control pad 42a, 42b of each diode 30a, 30b.

The timing adjusting unit 62 includes a first timing adjusting unit 62a for delaying the driving signal to be input into the second IGBT 70b by a predetermined time and a second timing adjusting unit 62b for advancing the driving signal to be input into the second IGBT 70b by a predetermined time. the NOT gate 63 includes a first NOT gate 63a for reversing the polarity of the driving signal, a timing of which is delayed by the first timing adjusting unit 62a, and a second NOT gate 63b for reversing the polarity of the driving signal, a timing of which is advanced by the second timing adjusting unit 62b. The AND gate 64 includes a first AND gate 64a and a second AND gate 64b. The driving signal and the output signal from the first NOT gate 63a are input into the first AND gate 64a. The driving signal and the output signal from the second NOT gate 63b are input into the second AND gate 64b. The output signal of the first AND gate 64a is input into the control pad 42a as the control signal of the first diode 30a. The output signal of the second AND gate 64b is input into the control pad 42b as the control signal of the second diode 30b.

As shown in FIG. 17, the generation unit 61 and the second IGBT 70b, the generation unit 61 and one input terminal of the first AND gate 64a, the generation unit 61 and one input terminal of the second AND gate 64b, are electrically coupled with each other via the buffer 65 and the resistor 66, respectively. The generation unit 61 and the other input terminal of the first AND gate 64a are electrically coupled with each other via the buffer 65, the first timing adjusting unit 62a, and the first NOT gate 63a. The generation unit 61 and the other input terminal of the second AND gate 64b are electrically coupled with each other via the buffer 65, the second timing adjusting unit 62b and the second NOT gate 63b. The output terminal of the first AND gate 64a and the control pad 42a of the first diode 30a are electrically coupled with each other. The output terminal of the second AND gate 64b and the control pad 42b of the second diode 30b are electrically coupled with each other.

Here, the second IGBT 70b has a gate capacitance. The second IGBT 70b is electrically coupled with the generation unit 61 via the buffer 65 and the resistor 66. Thus, the driving signal to be input into the second IGBT 70b is delayed by a time constant determined by the gate capacitance of the second IGBT 70b and the resistor 66, compared with the driving signal just after being output from the generation unit 61. The delayed driving signal is input into the second IGBT 70b, the one input terminal of the first AND gate 64a, and the one input terminal of the second AND gate 64b.

The above described first timing adjusting unit 62a includes a first resistor 67a having the resistance equal to the resistor 66 and a first capacitor 68a having a capacitance larger than the gate capacitance of the second IGBT 70b. The second timing adjusting unit 62b includes a second resistor 67b having a resistance equal to the resistor 66 and a second capacitor 68b having a capacitance smaller than the gate capacitance of the second IGBT 70b.

As shown in FIG. 17, the generation unit 61 and the first NOT gate 63a are electrically coupled with each other via the buffer 65 and the first timing adjusting unit 62a. The driving signal to be input into the first NOT gate 63a is delayed by a time constant determined by the first capacitor 68a and the first resistor 67a, compared with the driving signal just after being output from the generation unit 61.

Further, as shown in FIG. 17, the generation unit 61 and the second NOT gate 63b are electrically coupled with each other via the buffer 65 and the second timing adjusting unit 62b. Thus, the driving signal to be input into the second NOT gate 63b is delayed by a time constant determined by the second capacitor 68b and the second resistor 67b, compared with the driving signal just after being output from the generation unit 61. Thus, as described above, the delay is determined by the time constant. Accordingly, the resistance may be increased instead of increase of the capacitance. In this case, the same effect is obtained. In the present invention, the increase of the capacitance is explained.

As described above, the first capacitor 68a has a capacitance larger than the gate capacitance of the second IGBT 70b. The second capacitor 68b has a capacitance smaller than the gate capacitance of the second IGBT 70b. Thus, the driving signal to be input into the first NOT gate 63a is delayed by a difference between the gate capacitance and the capacitance of the first capacitor 68a, compared with the driving signal to be input into the second IGBT 70b. Further, the driving signal to be input into the second NOT gate 63b is advanced by a difference between the gate capacitance and the capacitance of the second capacitor 68b.

As a result, the driving signal is input into the other input terminal of the first AND gate 64a, the driving signal delayed by the capacitance difference compared with the driving signal (i.e., the driving signal to be input into the one input terminal of the first AND gate 64a) to be input into the second IGBT 70b and the polarity of the driving signal being reversed by the first NOT gate 63a. The driving signal is input into the other input terminal of the second AND gate 64b, the driving signal advanced by the capacitance difference compared with the driving signal (i.e., the driving signal to be input into the one input terminal of the second AND gate 64b) to be input into the second IGBT 70b and the polarity of the driving signal being reversed by the second NOT gate 63b.

FIGS. 18 to 20 show the above described driving signals and the output signals (the control signals to be input into the diodes 30a, 30b, respectively) from the AND gates 64a, 64b. The horizontal axis in FIGS. 18 to 20 represents time, and the vertical axis represents an arbitrary unit. Pulse 1 represents the driving signal to be input into the first IGBT 70a, and Pulse 2 represents the driving signal to be input into the second IGBT 70b, the one input terminal of the first AND gate 64a and the one input terminal of the second AND gate 64b. Pulse 3 represents the driving signal to be input into the other input terminal of the first AND gate 64a, and Pulse 4 represents the driving signal to be input into the other input terminal of the second AND gate 64b. Pulse 23 represents a signal output from the first AND gate 64a, i.e., the control signal to be input into the control pad 42a of the first diode 30a. Pulse 24 represents a signal output from the second AND gate 64b, i.e., the control signal to be input into the control pad 42b of the second diode 30b. Here, Pulse 23 corresponds to Pulse 11 shown in FIG. 14, and Pulse 24 corresponds to Pulse 22 shown in FIG. 16.

The time period t5 shown in FIGS. 18 and 19 represents a delayed time of Pulse 3, which is delayed from Pulse 2 by the capacitance difference between the gate capacitance and the first capacitor 68a. The time period t6 shown in FIGS. 18 and 20 represents an advanced time of Pulse 4, which is advanced from Pulse 2 by a capacitance difference between the gate capacitance and the second capacitor 68b. The time periods t5, t6 can be controlled by adjusting the capacitances of the capacitors 68a, 68b, respectively. In the present embodiment, the time period t5 is equal to the time period t6. As shown in FIG. 19, during the time period t5, the channel is formed in the second IGBT 70b, and the collector current starts to flow.

As shown in FIGS. 18 and 19, only when both of the voltage levels of Pulse 2 and Pulse 3 are in the high level, the voltage level of Pulse 23 becomes the high level. Further, as shown in FIGS. 18 and 20, only when both of the voltage level of Pulse 2 and Pulse 4 are in the high level, the voltage level of Pulse 24 becomes the high level.

When the voltage level of Pulse 2 rises from the low level to the high level, the voltage level of Pulse 23 becomes the high level. When the first IGBT 70a is in the off state, and the transition period, in which the second IGBT 70b switches from the off state to the on state, starts, the control signal having the high level is output. As described in the fourth embodiment, under a condition that the induction type load 92 stores energy, and the current shown as the dashed dotted line in FIG. 13 flows, when the second IGBT 70b switches from the off state to the on state, the current shown as the dashed two-dotted line in FIG. 13 flows, and the reverse current flows in the first diode 30a. On the other hand, in the present modification example, when the transition period, in which the second IGBT 70b switches from the off state to the on state, starts, the control signal having the high level is input into the first diode 30a. Thus, before the reverse current flows in the first diode 30a, and during the reverse current flows in the first diode 30a, the control signal having the high level is input into the first diode 30a. Accordingly, the switching loss in the first diode 30a is reduced.

Here, as shown in FIG. 19, the voltage level of Pulse 23 is in the low level in a period other than the transition period, in which the second IGBT 70b switches from the off state to the on state. The above period includes a period in which the forward current flows in the first diode 30a. When the forward current flows in the first diode 30a, the control signal having the low level is input into the control pad 42a of the first diode 30a. Thus, the injection amount of the minority carrier into the first semiconductor layer 11 of the first diode 30a increases, and therefore, the stationary loss in the first diode 30a is reduced.

The voltage level of Pulse 24 becomes the high level at the predetermined time period t6 before the voltage level of Pulse 2 falls from the high level to the low level. The control signal having the high level is output when the second IGBT 70b is in the on state, and before the transition period, in which the first IGBT 70a switches from the off state to the on state. As described in the fourth embodiment, under a condition that the induction type load 92 stores energy, and the current shown as the dashed dotted line in FIG. 15 flows, when the first IGBT 70a switches from the off state to the on state, the current shown as the dashed two-dotted line in FIG. 15 flows, and the reverse current flows in the second diode 30b. On the other hand, in the present modification example, the control signal having the high level is input into the second diode 30b before the transition period, in which the first IGBT 30a switches from the off state to the on state. Thus, the control signal having the high level is input into the second diode 30b before the reverse current flows in the second diode 30b. Accordingly, the switching loss in the second diode 30b is reduced.

Here, as shown in FIG. 20, the voltage level of Pulse 24 is in the low level in a period other than the transition period, in which the first IGBT 70a switches from the off state to the on state. The above period includes a period in which the forward current flows in the second diode 30b. When the forward current flows in the second diode 30b, the control signal having the low level is input into the control pad 42b of the second diode 30b. Thus, the injection amount of the minority carrier into the first semiconductor layer 11 of the second diode 30b increases, and therefore, the stationary loss in the second diode 30b is reduced.

Figure 21:
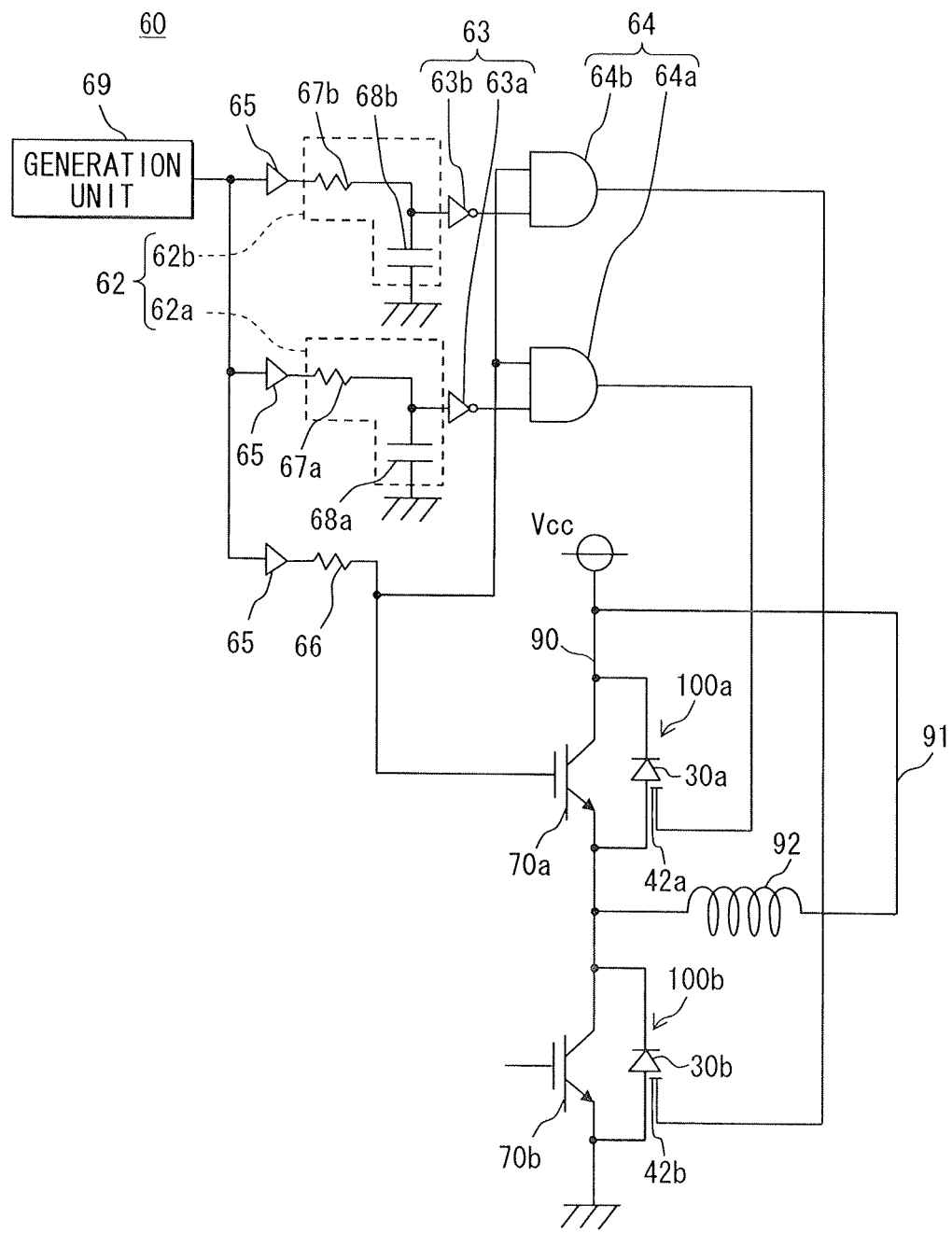
FIG. 21 is a circuit diagram showing the control circuit according to a modification.
Figure 22:
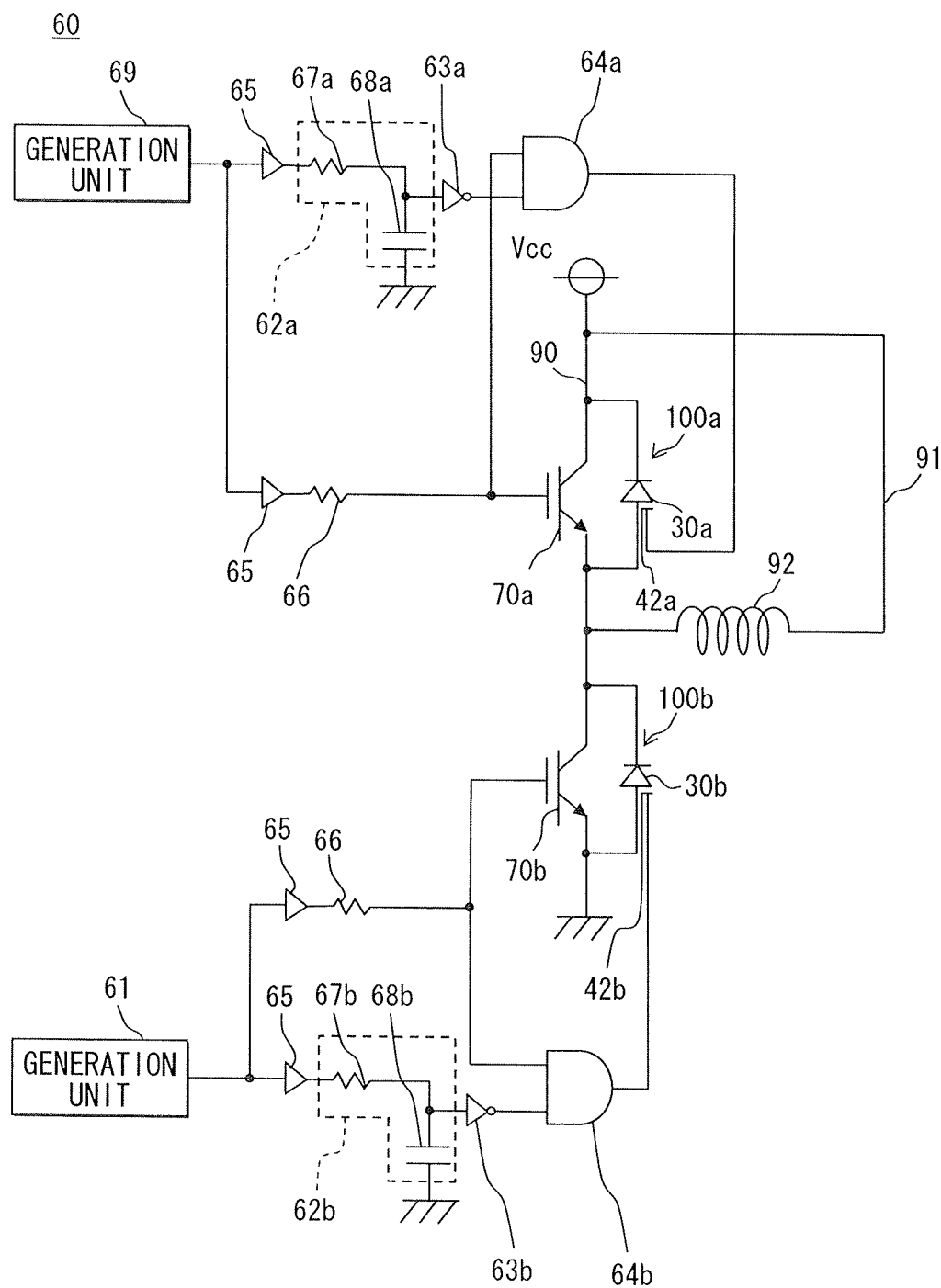
FIG. 22 is a circuit diagram showing the control circuit according to a modification.

In the above modification example, the control circuit 60 generates the control signal based on the driving signal of the generation unit 61 for inputting the driving signal into the second IGBT 70b. However, for example, as shown in FIG. 21, the control circuit 60 may generate the control signal based on the driving signal of the generation unit 69 for inputting the driving signal into the first IGBT 70a. Alternatively, as shown in FIG. 22, the control circuit 60 may generate the control signal based on the driving signal of the generation unit 69 for inputting the driving signal into the first IGBT 70a and the driving signal of the generation unit 61 for inputting the driving signal into the second IGBT 70b. FIGS. 21 and 22 are circuit diagrams showing modification examples of the control circuit. In FIG. 21, the generation unit 61 is not shown so as to simplify the explanation.

In the modification example in FIG. 22, the capacitance of each capacitor 68a, 68b is larger than the gate capacitance of each IGBT 70a, 70b or smaller than the gate capacitance of each IGBT 70a, 70b. When the capacitance of each capacitor 68a, 68b is larger than the gate capacitance of each IGBT 70a, 70b, the control signal having the high level is input into the first diode 30a when the transition period, in which the second IGBT 70b switches from the off state to the on state, starts. The control signal having the high level is input into the second diode 30b when the transition period, in which the first IGBT 70a switches from the off state to the on state, starts. Further, when the capacitance of each capacitor 68a, 68b is smaller than the gate capacitance of each IGBT 70a, 70b, the control signal having the high level is input into the first diode 30a before the transition period, in which the second IGBT 70b switches from the off state to the on state. The control signal having the high level is input into the second diode 30b before the transition period, in which the first IGBT 70a switches from the off state to the on state.

(Fifth Embodiment)

Figure 23:
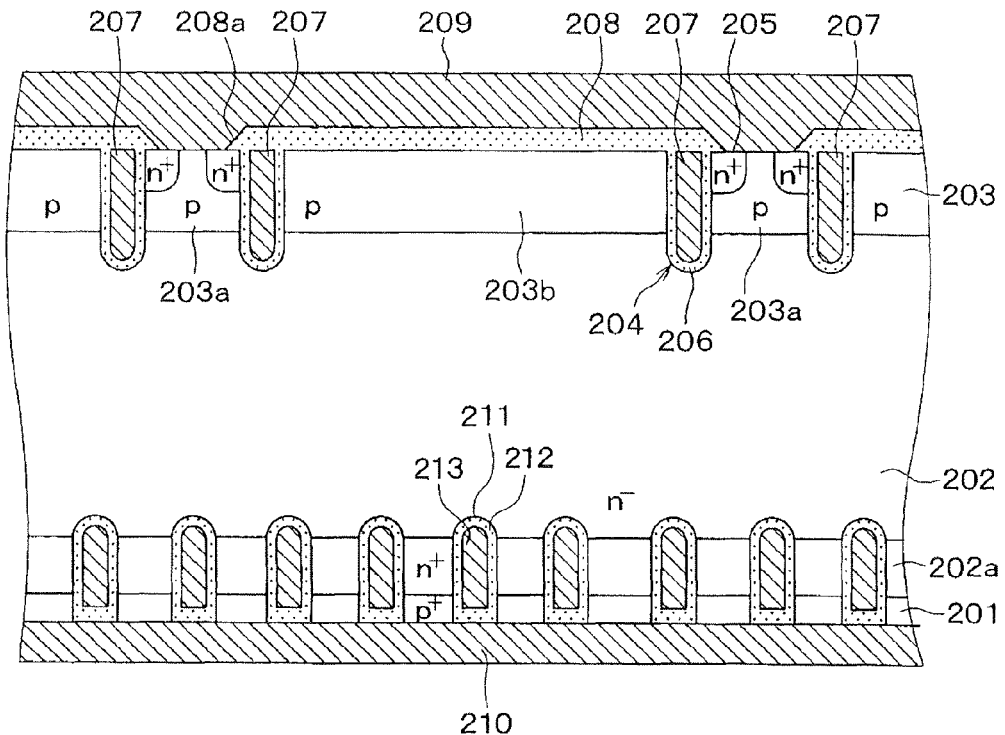
FIG. 23 is a diagram showing a cross sectional view of a semiconductor device having an IGBT according to a fifth embodiment.

FIG. 23 is a cross sectional view showing a cross sectional structure of a semiconductor device having an IGBT according to the present embodiment. The semiconductor device having the IGBT according to the present embodiment will be explained with reference to the drawings.

As shown in FIG. 23, a cell region having the IGBT and an outer periphery region surrounding an outer periphery of the cell region are formed in the semiconductor device according to the present embodiment. A FS layer (i.e., field stop layer) 202a made of a N conductive type impurity layer having a high impurity concentration is formed on the surface of a P+ conductive type collector layer 201. Further, a N− conductive type drift layer 202 having an impurity concentration lower than the P+ conductive type collector layer 201 and the FS layer 202a is formed on the FS layer 202a. It is not necessary to include the FS layer 202a. However, the device includes the FS layer 202a in order to improve the performance of the breakdown voltage and the stationary loss and further to control the injection amount of the holes to be injected from the backside of the substrate by restricting expansion of a depletion layer.

A structure that the P+ conductive type collector layer 201, the FS layer 202a and the N− conductive type drift layer 202 are arranged in this order is prepared such that, for example, a later described element structure is formed in a surface portion of a FZ substrate having the N conductive type for providing the N− conductive type drift layer 202, and then, a N conductive type impurity and a P conductive type impurity are implanted and thermally diffused after polishing the backside so that the P+ conductive type collector layer 201 and the FS layer 202a are formed. Alternatively, the FS layer 202a and the N-conductive type drift layer 202 may be grown epitaxially on the semiconductor substrate having the P conductive type for providing the P+ conductive type collector layer 201.

A P conductive type base region 203 having a predetermined thickness is formed in a surface portion of the N− conductive type drift layer 202. Further, multiple trenches 204 are formed to penetrate the P conductive type base region 203 and to reach the N− conductive type drift layer 202. The P conductive type base region 203 is divided into multiple portions by the trenches 204. Specifically, the trenches 204 are arranged at predetermined pitches (predetermined intervals). The trenches 204 have a stripe pattern such that the trenches 204 extend in parallel to each other along with the depth direction (i.e., a direction perpendicular to a sheet of the drawing) in FIG. 23, or a ring shaped structure such that the trenches 204 extend in parallel to each other and a top of each trench 204 is bent. When the trenches 204 have the ring shaped structure, each trench 204 provides a ring, and multiple rings provide one set so that multiple ring structure is formed. Thus, longitudinal directions of adjacent multiple ring structures are in parallel to each other.

The P conductive type base region 203 is divided into multiple portions by adjacent trenches 204. A part of the portions of the base region 203 provides a P conductive type channel layer 203a for providing a channel region. A N+ conductive type emitter region 205 is formed in a surface portion of the P conductive type channel layer 203a.

The N+ conductive type emitter region 205 has an impurity concentration higher than the N− conductive type drift layer 202. The emitter region 205 is terminated in the P conductive type base region 203. Further, the emitter region 205 is arranged to contact the sidewall of the trench 204. Specifically, the emitter region 205 extends along with a longitudinal direction of the trench 204 to have a bar shape. The emitter region 205 is terminated on a shallower side from a bottom of the trench 204.

A gate insulation film 206 is formed to cover the inner wall of each trench 204. A gate electrode 207 made of doped poly silicon or the like is formed in the surface of the gate insulation film 206. The gate insulation film 206 and the gate electrode 207 fill in each trench 204.

Further, an insulation film 208 is formed on a surface of the substrate. An emitter electrode 209 is formed on the insulation film 208. The emitter electrode 209 is electrically coupled with the N+ conductive type emitter region 205 and the P conductive type channel layer 203a via a contact hole 208a formed in the insulation film 208. Further, a collector electrode 210 is formed on the backside of the P+ conductive type substrate 201 so as to electrically couple with the P+ conductive type substrate 201. Thus, a fundamental structure of the IGBT is formed.

In the present embodiment, multiple trenches 211 are formed on the P+ conductive type substrate 201 in the cell region, in which the above described IGBT is arranged. Each trench 211 is formed to penetrate the P+ conductive type substrate 201 and the FS layer 202a and to reach the N-conductive type drift layer 202. The trenches 211 are arranged to have a stripe pattern such that the trenches 211 are separated from each other by a predetermined distance (e.g., at regular intervals). A gate insulation film 212 formed to cover the inner wall of each trench 211 and a control gate electrode 213 made of doped poly silicon or the like and formed on the surface of the gate insulation film 212 are embedded in the trench 211. In the present embodiment, the control gate electrodes 213 are electrically coupled with each other at a place, which is provided by another cross sectional view, and are coupled with an external element so that the potential of the control gate electrode 13 can be controlled.

The function of the semiconductor device according to the present embodiment will be explained.

First, when the device is in an off state, the gate voltage is not applied to the gate electrode 7. Thus, a reverse layer with respect to the P conductive type channel layer 203a is not formed. Accordingly, the current between the collector and the emitter is off. Then, when the gate voltage is applied to the gate electrode 7, the reverse layer is formed with respect to the P conductive type channel layer 203a, and the current between the collector and the emitter flows so that the device turns on.

In the above operation, when the positive voltage (e.g., the voltage V>0) with respect to the collector voltage is applied to the control gate electrode 213, the voltage affects on the P+ conductive type substrate 201 for providing the collector region and the FS layer 202a via the gate insulation film 212. Thus, a situation proceeds toward reduction of the holes in the P+ conductive type substrate 201, and toward accumulation of the electrons in the FS layer 202a. Accordingly, when the device is in the on state, the injection amount of the holes to be injected from the P+ conductive type substrate 201 to the N+ conductive type emitter region 205 is reduced. Specifically, regarding device characteristics, although the stationary loss increases, the switching loss decreases.

On the other hand, when the negative voltage (e.g., the voltage V<0) with respect to the collector voltage is applied to the control gate electrode 213, the voltage affects on the P+ conductive type substrate 201 for providing the collector region and the FS layer 202a via the gate insulation film 212. Thus, a situation proceeds toward accumulation of the holes in the P+ conductive type substrate 201 and toward reduction of the electrons in the FS layer 202a. Accordingly, when the device is in the on state, the injection amount of the holes to be injected from the P+ conductive type substrate 201 to the N+ conductive type emitter region 5 increases. Specifically, regarding device characteristics, although the switching loss increases, the stationary loss decreases.

As explained above, the semiconductor device according to the present embodiment includes the control gate electrode 213 in the cell region, in which the IGBT is arranged, for adjusting the hole amount in the P+ conductive type substrate 201 for providing the collector region and the electron amount in the FS layer 202a.

Accordingly, after the device manufacturing process ends, the semiconductor device can adjust and optimize the stationary loss and the switching loss. Further, a designer of an application (i.e., an user of the device) can set an optimum loss according to usage conditions such as a driving frequency by controlling a voltage to be applied to the control gate electrode 213. Further, it is not necessary to proceed development of a manufacturing process for a custom device, which requires substantial time conventionally. The development is such that device manufacturing conditions are determined, and evaluation of application is repeated through trial and error.

When the driving frequency and the temperature are varied with time during the operation of the device, the voltage to be applied to the control gate electrode 213 is adjusted so that the device performance (such as loss characteristics and surge characteristics) optimized with respect to the frequency and the temperature can be obtained.

Further, the optimum control in view of the switching loss and the surge is performed in addition to the optimization of the stationary loss and the switching loss by adjusting the voltage to be applied to the control gate electrode 213. The optimum control will be explained as follows.

Regarding the switching operation of the IGBT, when the injection amount of the holes from the P+ conductive type substrate for providing the collector region is small, the switching loss is small since the holes are rapidly removed in case of turning off. However, the voltage surge is large since the potential is rapidly changed.

On the other hand, when the injection amount of the holes from the P+ conductive type substrate for providing the collector region is large, the switching loss is large since it takes much time to remove the holes in case of turning off. However, the voltage surge is small since the potential is moderately changed.

The temperature characteristics of the voltage surge and the loss in case of switching operation are such that: (1) the switching loss increases as the temperature increases although the voltage surge caused by the switching operation is reduced as the temperature increases; and (2) the switching loss decreases as the temperature decreases although the voltage surge caused by the switching operation increases as the temperature decreases.

Accordingly, when it is not necessary to focus on the voltage surge since the temperature is high, the positive voltage with respect to the collector voltage is applied to the control gate electrode 213 so that the loss is effectively restricted. When it is not necessary to focus on the loss since the temperature is low, the negative voltage with respect to the collector voltage is applied to the control gate electrode 213 so that the voltage surge is effectively restricted. Thus, the optimum performance according to the environmental temperature is obtained.

(Sixth Embodiment)

In the present embodiment, the structure of the control gate electrode 213 in the semiconductor device according to the fifth embodiment is changed. Other features are similar to the fifth embodiment. Thus, only different features from the first embodiment will be explained.

Figure 24:
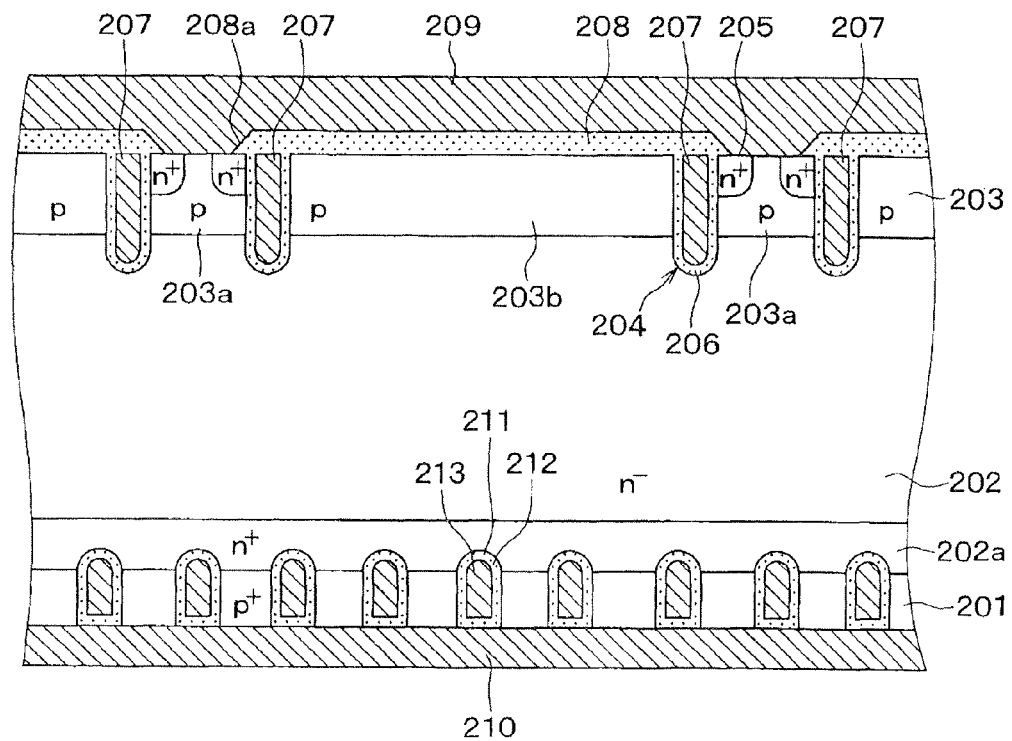
FIG. 24 is a diagram showing a cross sectional view of a semiconductor device having an IGBT according to a sixth embodiment.

FIG. 24 is a cross sectional view of the semiconductor device having the IGBT according to the present embodiment. As shown in the drawing, the depth of the trench 211, in which the control gate electrode 213 is arranged, is shallower than that in the fifth embodiment. Specifically, the trench 211 penetrates only the P+ conductive type substrate 201, and does not penetrate the FS layer 202a. This structure is different from the fifth embodiment.

In the above structure, it is difficult to control to reduce and to accumulate the electrons in the FS layer 202a based on the voltage applied to the control gate electrode 213. However, the hole amount in the P+ conductive type substrate 201 can be controlled, similar to the fifth embodiment. Further, the FS layer 202a for improving the breakdown voltage can be flat. Thus, the breakdown voltage of the device is effectively improved, and further, the injection amount of the minority carrier from the P+ conductive type substrate 201 can be controlled.

(Seventh Embodiment)

In the present embodiment, the outer periphery region surrounding the cell region also includes the control gate electrode 213 in the semiconductor device according to the fifth and sixth embodiments. Other features are similar to the fifth embodiment. Thus, only different features from the fifth embodiment will be explained.

Figure 25:
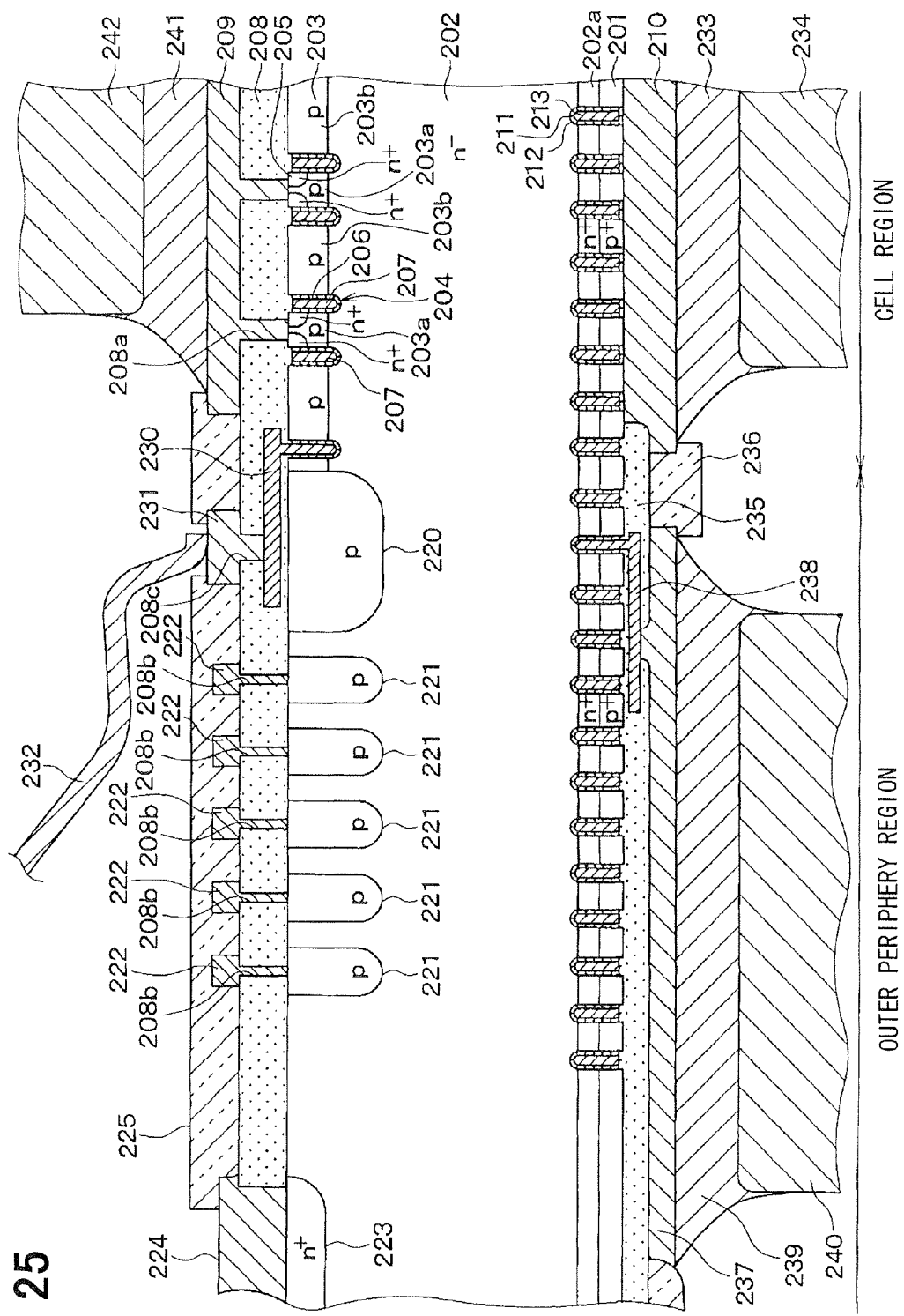
FIG. 25 is a diagram showing a cross sectional view and a wiring structure of a semiconductor device having an IGBT according to a seventh embodiment.

FIG. 25 is a cross sectional view showing a cross sectional structure and a wiring structure of the semiconductor device having the IGBT according to the present embodiment. As shown in the drawing, the cell region includes the IGBT similar to the structure according to the fifth embodiment. A P conductive type diffusion layer 220 is formed in a surface portion of the N-conductive type drift layer 202. The layer 220 surrounds the outer periphery of the cell region, and is deeper than the p conductive type base region 203. Further, a P conductive type guard ring layer 221 having a multiple ring structure is formed I the outer periphery region so as to surround the outer periphery of the P conductive type diffusion layer 220. Each P conductive type guard ring layer 221 is electrically coupled with an outer periphery electrode 222 via a contact hole 208b formed in the insulation film 208. The outer periphery electrode 222 is arranged to correspond to the P conductive type guard ring layer 221. The outer periphery electrodes 222 are electrically separated from each other. The outer periphery electrodes 222 have a multiple ring structure, similar to the P conductive guard ring layers 221.

A N+ conductive type layer 223 is formed in a surface portion of the N-conductive type drift layer 202 to surround the P conductive type guard ring layer 221. An electrode 224 is formed on the N+ conductive type layer 223. Thus, an equipotential ring (i.e., EQR) structure is formed. The protection film 225 covers a place of the outer periphery region, which is not electrically coupled. Thus, the fundamental structure of the outer periphery region is prepared.

Here, a doped poly silicon layer 230 is formed on the p conductive type diffusion layer 220 via the insulation film 8. The doped poly silicon layer 230 functions to couple each gate electrode 207 with an external element electrically. Specifically, the poly silicon layer 230 is electrically coupled with each gate electrode 207, and further, is electrically coupled with a gate pad 231 via a contact hole 208c formed in the insulation film 208. A bonding wire 232 is bonded to the gate pad 231 so that the gate electrode 207 is electrically coupled with the external element.

The trench 211 similar to the structure of the cell region is formed on the backside of the semiconductor device in the outer periphery region having the above fundamental structure. Further, the outer periphery region has the structure such that the gate insulation film 212 and the control gate electrode 213 are arranged in the trench 211. The control gate electrode 213 in the outer periphery region is electrically coupled with the control gate electrode 213 in the cell region at a place, which is provided by a different cross section. The voltage to the control gate electrode 213 in the cell region and the control gate electrode 213 in the outer periphery region is applied from the outer periphery region. In the cell region, a current passage for flowing current through the collector electrode and the emitter electrode is formed.

Specifically, in the cell region, the collector electrode 210 is electrically coupled with the lead frame 234 via the solder 233. In the outer periphery region, an outer periphery backside electrode 237 is arranged to insulate and separate from the collector electrode 210 by the insulation film 235 and the protection film 236. Each control gate electrode 213 formed in the cell region and in the outer periphery region is electrically coupled with the outer periphery backside electrode 237 via the doped poly silicon layer 238 formed in the insulation film 235. The outer periphery backside electrode 237 is electrically coupled with the lead frame 240 via the solder 239 so that a voltage is applied to each control gate electrode 213 formed in the cell region and in the outer periphery region.

Here, the emitter electrode 209 is connected to the lead frame 242 via the solder 241. The current flows between the collector and the emitter via the solder 233 and the lead frame 234 electrically coupled with the collector electrode 210 and the solder 241 and the lead frame 242 electrically coupled with the emitter electrode 209.

Thus, the control gate electrode 213 is also formed in the outer periphery region. Further, the device has the structure such that electrical coupling to each control gate electrode 213 arranged in the cell region and in the outer periphery region is performed in the outer periphery region.

Here, in FIG. 25, a structure is explained such that the trench 211 having the control gate electrode 213 embedded therein penetrates the FS layer 202a and reaches the N− conducive type drift layer 202, similar to the fifth embodiment. Alternatively, the structure according to the present embodiment may be applied to the construction such that the trench 211 does not penetrate the FS layer 202a, similar to the sixth embodiment.

(Eighth Embodiment)

In the present embodiment, the control gate electrode 213 is disposed in the outer periphery region, similar to the seventh embodiment. A wiring structure for coupling between the control gate electrode 213 and an external element electrically is different from the seventh embodiment. Other features are similar to the third embodiment. Thus, only different features from the seventh embodiment will be explained.

Figure 26:
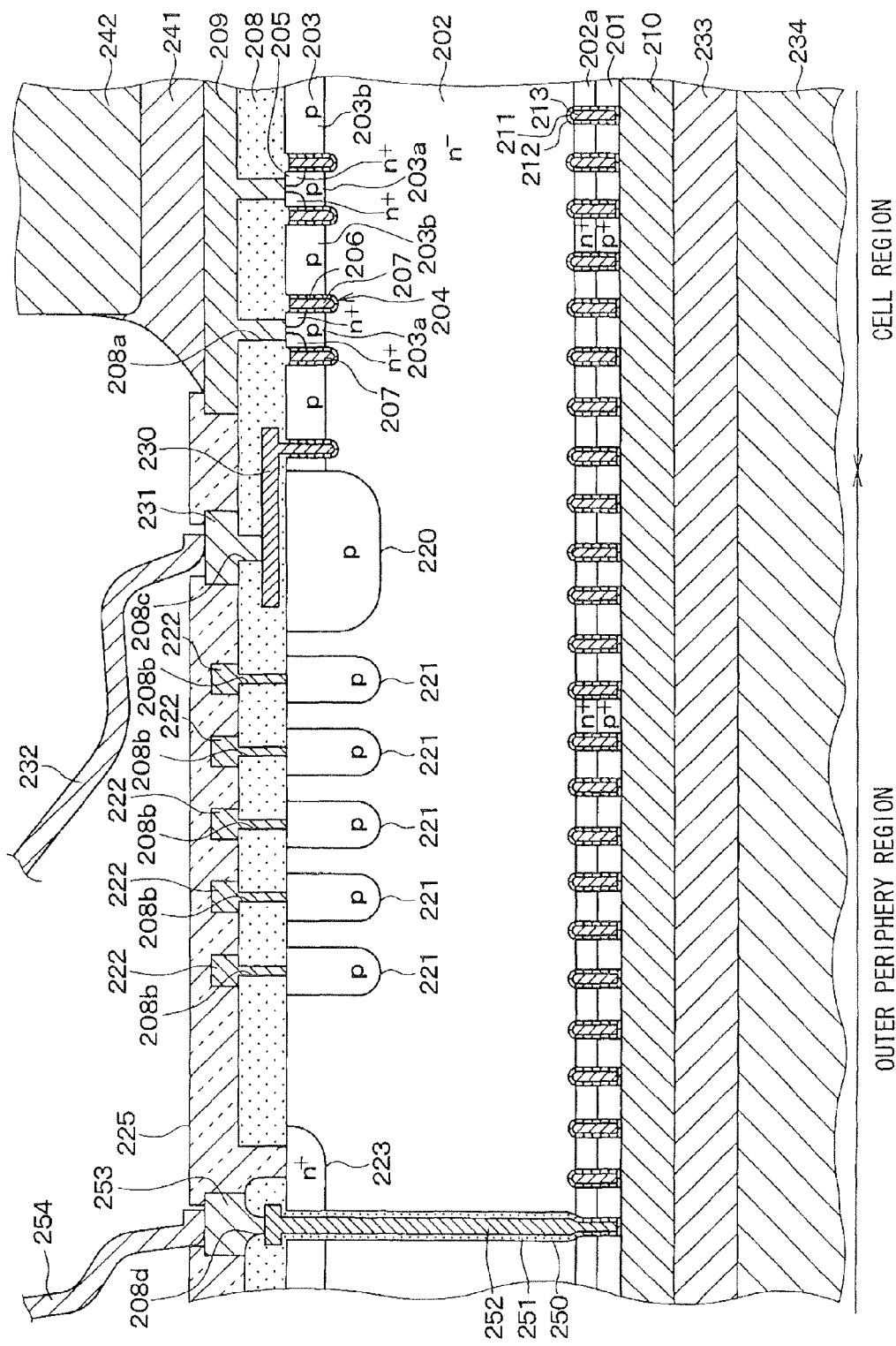
FIG. 26 is a diagram showing a cross sectional view and a wiring structure of a semiconductor device having an IGBT according to a eighth embodiment.

FIG. 26 is a cross sectional view showing a cross sectional structure and a wiring structure of the semiconductor device having the IGBT according to the present embodiment. As shown in this drawing, the collector electrode 210, the solder 233 and the lead frame 234 are formed on a whole of not only the cell region but also the outer periphery region. The wiring structure for electrically coupling between the control gate electrode 213 and the external element includes a through hole 250, an insulation film 251, a wiring layer 252 and a pad 253. The through hole 250 in the outer periphery region penetrates the N− conductive type drift layer 202 so that the hole 250 is connected to the trench 211. The insulation film 251 is formed to cover the inner wall of the through hole 250. The wiring layer 252 is embedded in the through hole 250 and made of doped poly silicon or the like. The pad 253 is electrically coupled with the wiring layer 252 via a contact hole 208c formed in the insulation film 208. A bonding wire 254 is connected to the pad 253. The external element applies a predetermined voltage to the control gate electrode 213 via the wiring layer 252, the pad 253 and the bonding wire 254.

A position of the through hole 250 may be any. It is preferred that the through hole 250 is formed at a position, which has the same potential as the collector region, in order to avoid insulation breakdown caused by potential interference or potential difference. For example, in case of a discrete device, as shown in FIG. 26, the through hole 250 may be formed at a position disposed on an outside of the outer periphery region, at which an outer periphery withstand structure is formed. Here, although the discrete device is illustrated as an example, the structure according to the present embodiment may be applied to a switching device having a built-in IC.

Thus, the wiring layer 252 is retrieved to the surface side of the semiconductor device via the through hole 250 so that electrical connection between the control gate electrode 213 and the external element can be performed on the surface side.

In FIG. 26, a structure is explained such that the trench 211 having the control gate electrode 213 embedded therein penetrates the FS layer 202a and reaches the N− conductive type drift layer 202. The structure according to the present embodiment may be applied to the structure such that the trench 211 does not penetrate the FS layer 202a, similar to the sixth embodiment.

(Ninth Embodiment)

In the present embodiment, similar to the seventh and eighth embodiments, the control gate electrode 213 is disposed in the outer periphery region. A pitch between the control gate electrodes 213 in the cell region is different from that in the outer periphery region, which is different from the seventh and eighth embodiments. Other features are similar to the seventh and eighth embodiments. Only different features from the seventh and eighth embodiments will be explained.

Figure 27:
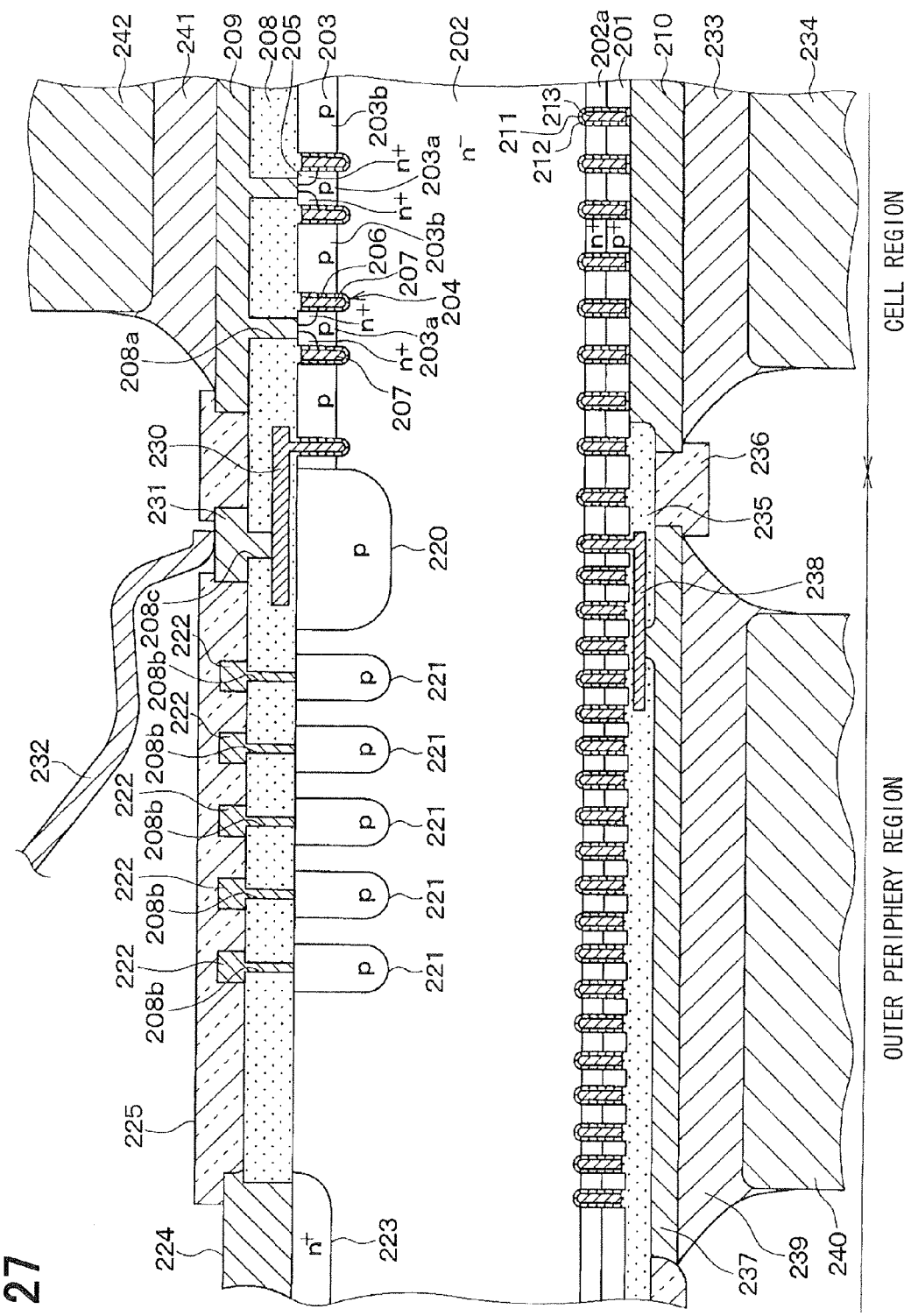
FIG. 27 is a diagram showing a cross sectional view and a wiring structure of a semiconductor device having an IGBT according to a ninth embodiment.

FIG. 27 is a cross sectional view showing a cross sectional structure and a wiring structure of the semiconductor device having the IGBT according to the present embodiment. As shown in this drawing, the pitch (distance) between adjacent trenches 204 of the cell region in which the control gate electrode 213 is disposed is different from that of the outer periphery region, with respect to the structure according to the seventh embodiment. Specifically, the distance of the outer periphery region is narrower than the distance of the cell region.

The distance between adjacent trenches 204 in the cell region is different from that in the outer periphery region, so that the minority carrier amount to be injected from the P+ conductive type substrate 201 in the cell region is different from that in the outer periphery region in the same chip.

For example, when the minority carrier is removed in case of turning off, a large amount of the minority carrier from the outer periphery region surrounding the cell region may concentrate at an outer end of the cell region so that the device is broken down.

However, in the structure according to the present embodiment, the arrangement density of the control gate electrode 213 in the outer periphery region is higher than that in the cell region. Thus, when the positive voltage with respect to the collector region is applied to the control gate electrode 213, the minority carrier amount to be injected into the outer periphery region is limited, compared with the minority carrier amount to be injected from the cell region. Accordingly, the device breakdown caused by the carrier concentration at the outer end of the cell region is restricted.

Here, the distance between the adjacent control gate electrodes 213 is different with respect to the structure according to the seventh embodiment has been explained. The structure according to the eighth embodiment may have the same structure.

(Tenth Embodiment)

In the present embodiment, the control gate electrode 213 is disposed in the outer periphery region, similar to the seventh embodiment. A potential of a part of the control gate electrode 213 formed in the cell region and a potential of the other part of the control gate electrode 213 formed in the outer periphery region are independently controlled, which is different from the seventh embodiment. Other features are similar to the seventh embodiment. Only different features from the seventh embodiment will be explained.

Figure 28:
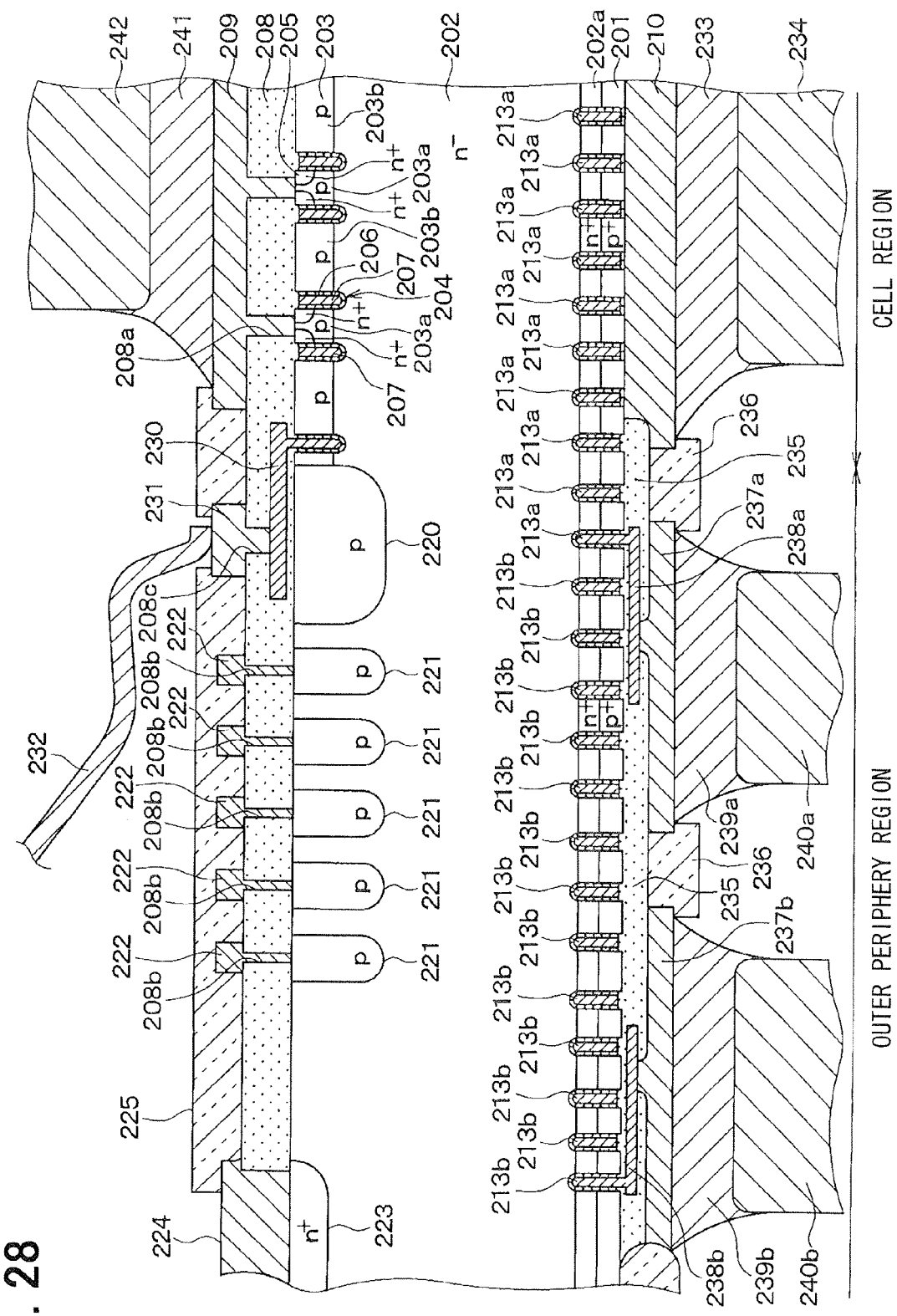
FIG. 28 is a diagram showing a cross sectional view and a wiring structure of a semiconductor device having an IGBT according to a tenth embodiment.

FIG. 28 is a cross sectional view showing a cross sectional structure and a wiring structure of the semiconductor device having the IGBT according to the present embodiment. As shown in this drawing, a part 213a of the control gate electrode 213 arranged in the cell region is coupled with an outer periphery backside electrode 237a on the backside of the outer periphery region, and the other part 213b of the control gate electrode 213 arranged in the outer periphery region is coupled with another outer periphery backside electrode 237b. The control gate electrode 213a in the cell region is not connected to the control gate electrode 213b in the outer periphery region so that they are insulated and separated from each other.

Specifically, in the outer periphery region, the outer periphery backside electrodes 273a, 273b are insulated and separated from each other by the insulation film 235 and the protection film 236. The outer periphery backside electrodes 237a, 237b are electrically coupled with the solders 239a, 239b and the lead frames 240a, 240b via the doped poly silicon layers 238a, 238b formed in the insulation film 235, respectively. Thus, the control gate electrode 213a arranged in the cell region and the control gate electrode 213b arranged in the outer periphery region are electrically coupled with the different lead frames 240a, 240b, respectively. The different voltages can be applied to the control gate electrodes 213a, 213b arranged in different regions, respectively.

As explained above, in the present embodiment, the different voltages can be applied to the control gate electrodes 213a, 213b arranged in the cell region and the outer periphery region, respectively.

In the above structure, when a voltage applied to the control gate electrode 213a in the cell region with respect to the collector voltage applied to the collector region is higher than a voltage applied to the control gate electrode 213b in the outer periphery region with respect to the collector voltage applied to the collector region, the minority carrier amount to be injected into the outer periphery region is limited to be smaller than the minority carrier amount to be injected from the cell region. Accordingly, the device breakdown caused by the carrier concentration at the outer end of the cell region is restricted.

In the present embodiment, the control gate electrodes 213a, 213b arranged in the cell region and the outer periphery region are electrically coupled with different electrodes, respectively, with respect to the structure according to the seventh embodiment. Alternatively, the structure according to the eighth embodiment may have the same structure. In this case, the wirings electrically coupled with the control gate electrodes 213a, 213b may be retrieved on the surface side of the semiconductor device. Alternatively, only one of the wirings may be retrieved on the surface side.

(Eleventh Embodiment)

In the present embodiment, the device structure of the semiconductor device according to the fifth to tenth embodiments is partially changed. Other features are similar to the fifth to tenth embodiments. Only different features from the fifth to tenth embodiments will be explained.

Figure 29:
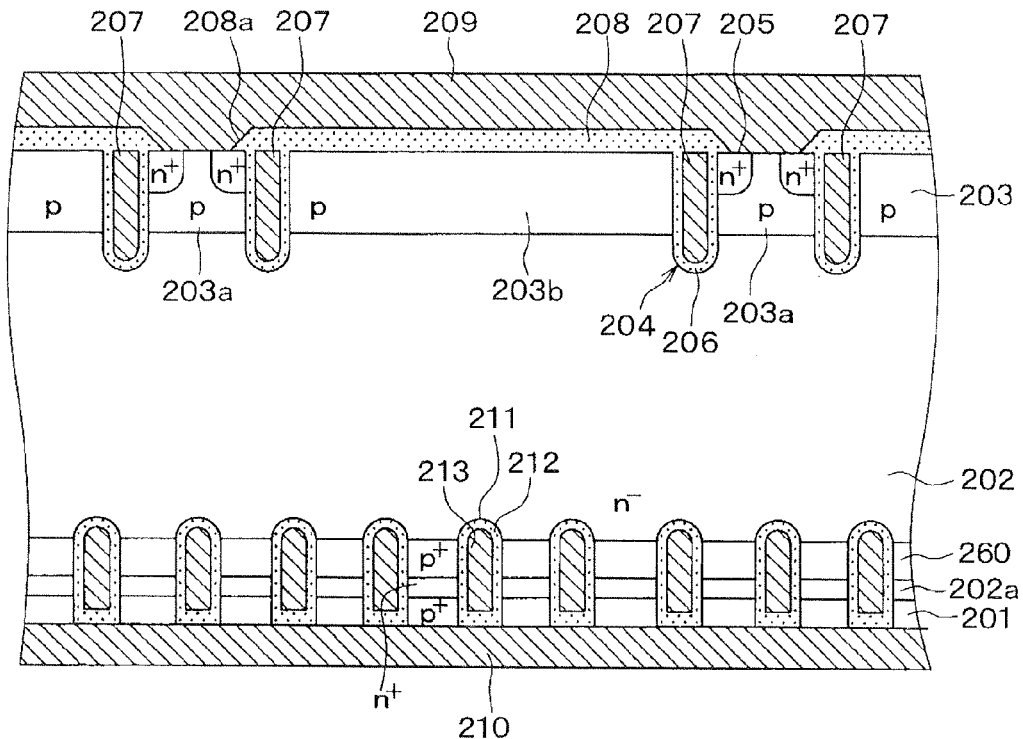
FIG. 29 is a diagram showing a cross sectional view and a wiring structure of a semiconductor device having an IGBT according to an eleventh embodiment.
Figure 30:
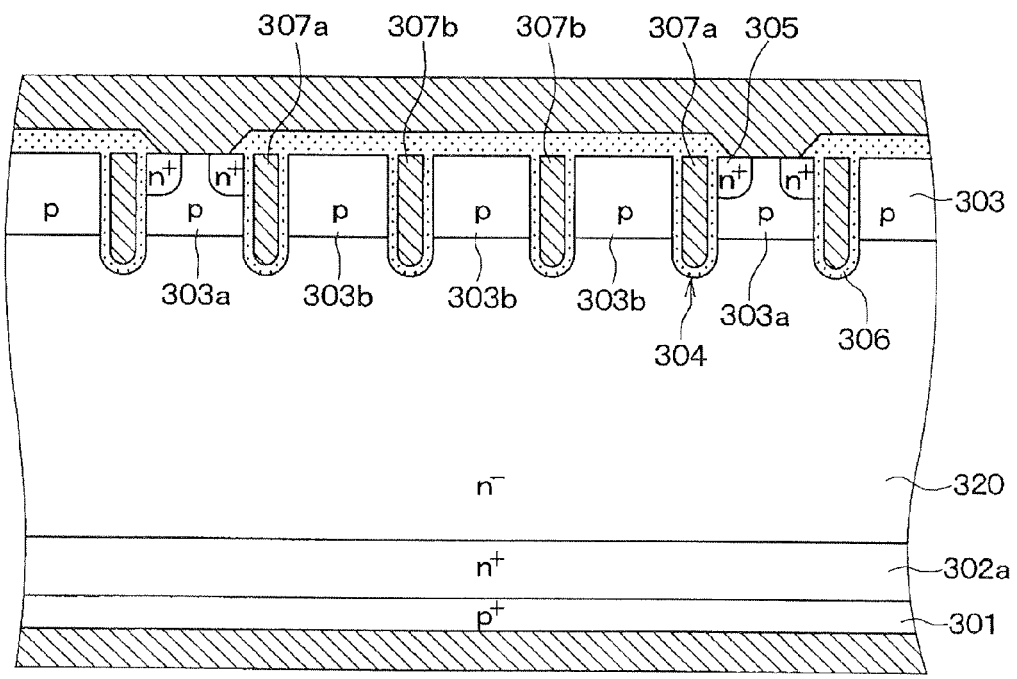
FIG. 30 is a diagram showing a cross sectional view and a wiring structure of a semiconductor device having an IGBT with a conventional FS layer.

FIG. 29 is a cross sectional view showing a cross sectional structure and a wiring structure of the semiconductor device having the IGBT according to the present embodiment. As shown in this drawing, in the semiconductor device according to the present embodiment, a P conductive type layer 260 is arranged between the FS layer 202a and the N− conductive type drift layer 202 so that a P channel type MOSFET having a trench gate structure on the collector side is formed.

In the above structure, the injection of the holes from the backside is controlled, similar to the above embodiments. Specifically, when the negative voltage with respect to the collector voltage is applied to the control gate electrode 213, the FS layer 202a is reversed so that the injection of the minority carrier starts or increases. When the positive voltage is applied to the control gate electrode 213, the injection of the minority carrier stops or decreases.

Thus, even when the P channel type MOSFET having the trench gate structure according to the present embodiment is arranged on the backside of the semiconductor device, the effects similar to the above embodiments are obtained.

(Other Embodiments)

In the fifth to tenth embodiments, the device includes the FS layer 202a. The structure according to the above embodiments may be applied to a structure such that the device does not include the FS layer 202a, i.e., the N-conductive type drift layer 202 is directly formed on the surface of the P+ conductive type substrate 201. In this case, the trench 211 may penetrate the P+ conductive type substrate 201. Alternatively, the depth of the trench 211 may be shallower than the thickness of the P conductive type substrate 201, and the bottom of the trench 211 may be disposed in the P+ conductive type substrate 201.

In the above fifth to tenth embodiments, one of electrical connection features of the emitter electrode 209, the collector electrode 210, the gate pad 231 and the outer periphery backside electrode 237, 273a, 237b with the external element includes a combination of the bonding wire, the solder and the lead frame. Alternatively, the electrical connection features may be provided by other ways such as conductive paste method.

The N channel type IGBT is explained as an example such that the first conductive type is the P conductive type, and the second conductive type is the N conductive type. The present invention may be applied to a P channel type IGBT such that the conductive type of each part is reversed.

The above disclosure has the following aspects.

According to a first aspect of the present disclosure, a semiconductor device includes: a semiconductor substrate including a first semiconductor layer having a first conductive type and at least one second semiconductor layer having a second conductive type and formed in a surface portion of a first surface of the first semiconductor layer; a diode including a first electrode and a second electrode; a control pad; a control electrode electrically coupled with the control pad; and an insulation member. The first electrode is formed on a second surface of the first semiconductor layer. The second electrode is formed on the first surface of the first semiconductor layer. Current flows between the first electrode and the second electrode. The control pad is arranged on the first surface of the first semiconductor layer, and the pad inputs a control signal for controlling an injection amount of a carrier into the first semiconductor layer. The insulation member insulates between the control electrode and the second electrode and between the control electrode and the semiconductor substrate.

When the first conductive type is the N conductive type, and the second conductive type is the P conductive type, the first semiconductor layer is the cathode layer having the N conductive type, and the second semiconductor layer is the anode layer having the P conductive type. The effects and functions of the above case will be explained as an example. In this case, the minority carrier in the first semiconductor layer is the hole, and the majority carrier is the electron. The minority carrier in the second semiconductor layer is the electron, and the majority carrier in the second semiconductor layer is the hole.

In the above device, the control electrode is formed on one principal surface of the first semiconductor layer. The control signal for controlling the injection amount of the minority carrier to flow into the first semiconductor layer is input into the control electrode via the control pad. Thus, when the positive or negative control signal is input into the control electrode, the injection amount of the minority carrier to flow into the first semiconductor layer is adjusted. When the positive control signal is input into the control electrode, the electrons are accumulated in a region of the second semiconductor layer (defined as a facing region) facing the control electrode via the insulation member, so that the hole concentration is reduced. In other words, the impurity concentration of the facing region becomes apparently low. Thus, the injection amount of the minority carrier to be injected from the facing region (i.e., the second semiconductor layer) to the first semiconductor layer is reduced. Further, the accumulation amount of the minority carrier accumulated in the first semiconductor layer is reduced. Thus, the switching loss is reduced. Further, when the negative control signal is input into the control electrode, the holes are accumulated in the facing region, so that the hole concentration increases. In other words, the impurity concentration of the facing region becomes apparently high. Thus, the injection amount of the minority carrier from the facing region (i.e., the second semiconductor layer) to the first semiconductor layer increases, so that the stationary loss is reduced. Thus, in the semiconductor device according to the present invention, the semiconductor device can adjust the stationary loss and the switching loss flexibly by controlling with the control signal even after the semiconductor device is manufactured.

Alternatively, the semiconductor device may further include: a temperature sensor for detecting temperature of the semiconductor substrate. A polarity and an amplitude of the control signal are determined based on an output signal of the temperature sensor. When the semiconductor substrate (i.e., the diode) is in a low temperature state, the injection amount (i.e., accumulation amount) of the minority carrier to flow into the first semiconductor layer for providing the diode increases. Thus, the reverse current increases, and the switching loss increases. On the other hand, when the semiconductor substrate (i.e., the diode) is in a high temperature state, the resistance of the semiconductor substrate increases, and the injection amount of the minority carrier to flow into the second semiconductor layer is reduced. Thus, the forward current decreases, and the stationary loss increases. However, in the above device, the polarity and the amplitude of the control signal are determined according to the output signal of the temperature sensor for detecting the temperature of the semiconductor device. Accordingly, when the diode is in the low temperature state, the positive control signal is input into the control electrode so that the increase of the switching loss is restricted. Oppositely, when the diode is in the high temperature state, the negative control signal is input into the control electrode so that the increase of the stationary loss is restricted.

Alternatively, the semiconductor device may further include: a switching element for controlling to open and to close according to a driving signal, a voltage level of which is switched. The diode is coupled in series with the switching element. A polarity and an amplitude of the control signal are determined based on a frequency of the driving signal. In general, when a switching element opens and closes, and the reverse current flows in the diode, the flowing difficulties may occur in some frequency range of the driving signal. For example, when the frequency of the driving signal is higher than a predetermined value, and the open/close frequency of the switching element is high, the number of occurrences that the reverse current flows in the diode increases. Thus, a ration between the switching loss with respect to the power loss in the diode becomes higher than a ratio between the stationary loss with respect to the power loss. On the other hand, when the frequency of the driving signal is lower than a predetermined value, and the open/close frequency in the switching element is low, the number of occurrences that the reverse current flows in the diode decreases. Thus, a ration between the stationary loss with respect to the power loss in the diode becomes higher than a ratio between the switching loss with respect to the power loss. However, in the above device, the polarity and the amplitude of the control signal are determined according to the frequency of the control signal for controlling to open and to close the switching element. Accordingly, when the frequency of the driving signal is higher than the predetermined value, the positive control signal is input into the control electrode. Thus, the increase of the switching loss, which has a ratio with respect to the power loss higher than the stationary loss, is restricted, so that the increase of the power loss is restricted. When the frequency of the driving signal is lower than the predetermined value, the negative control signal is input into the control electrode. Thus, the increase of the stationary loss, which has a ratio with respect to the power loss higher than the switching loss, is restricted, so that the increase of the power loss is restricted. Here, the above described predetermined value represents a frequency in a case where the ratio of the switching loss with respect to the power loss is equal to the ratio of the stationary loss with respect to the power loss.

Alternatively, the semiconductor device may further include: a switching element for controlling to open and to close according to a driving signal, a voltage level of which is switched. The diode is coupled in series with the switching element, and a polarity of the control signal is determined based on a timing for flowing a forward current through the diode and a timing for switching current flowing through the diode from the forward current to a reverse current. The stationary loss is generated when the forward current flows in the diode. The stationary loss is reduced when the injection amount of the minority carrier into the first semiconductor layer becomes large. The switching loss is generated when the reverse current flows in the diode. The switching loss is reduced when the accumulation amount of the minority carrier into the first semiconductor layer becomes small. However, in the above device, the polarity of the control signal is determined based on a timing for flowing a forward current through the diode and a timing for switching current flowing through the diode from the forward current to a reverse current. Accordingly, when the forward current flows in the diode, the negative control signal is input into the control electrode so that the injection amount of the minority carrier into the first semiconductor layer increases. Thus, the stationary loss is reduced. Further, when the current flowing through the diode is switched form the forward current to the reverse current, the positive control signal is input into the control electrode so that the accumulation amount of the minority carrier into the first semiconductor layer is reduced. Thus, the switching loss is reduced.

Alternatively, the semiconductor device may further includes: a switching element for controlling to open and to close according to a driving signal, a voltage level of which is switched, wherein the diode is coupled in series with the switching element; a driving signal generating unit for generating the driving signal; a timing adjusting unit for delaying or advancing the driving signal by a predetermined time; a NOT gate for reversing the polarity of the driving signal, timing of which is adjusted by the timing adjusting unit; and an AND gate for inputting the driving signal and an output signal from the NOT gate. The control signal is an output signal from the AND gate. For example, when the timing adjusting unit functions to delay the driving signal by a predetermined time, the driving signal to be input into the switching element and a signal prepared such that the driving signal is delayed by the predetermined time and the polarity is reversed by the NOT gate are input into the AND gate. As a result, since the driving signal is delayed by the predetermined time, a signal (i.e., a Hi-signal) having the voltage level of the driving signal equal to the high level and a Hi-level signal of the NOT gate are input into the AND gate at the same time. Further, a signal (i.e., Lo-signal) having the voltage level of the driving signal equal to the low level and a Lo-signal of the NOT gate are input into the AND gate at the same time. When the timing adjusting unit functions to advance the driving signal by a predetermined time, the driving signal to be input into the switching element and a signal prepared such that the driving signal is advanced by the predetermined time and the polarity is reversed by the NOT gate are input into the AND gate. As a result, since the driving signal is advanced by the predetermined time, the Hi-signal of the driving signal and the Hi-level signal of the NOT gate are input into the AND gate at the same time. Further, the Lo-signal of the driving signal and the Lo-signal of the NOT gate are input into the AND gate at the same time. The AND gate outputs the Hi-signal only when two input signals are the Hi-signals. Accordingly, when the Hi-signal of the riding signal and the Hi-signal of the NOT gate are input into the AND gate at the same time, the AND gate outputs the Hi-signal. The output signal of the AND gate corresponds to the control signal to be input into the diode. When the control signal is positive (i.e., when the voltage level is the high level), the accumulation amount of the minority carrier to be accumulated in the first semiconductor layer is reduced. Accordingly, when the AND gate outputs the Hi-signal before the minority carrier accumulated in the first semiconductor layer is discharged (i.e., before the reverse current flows in the diode), the switching loss is reduced. In a case where the timing adjusting unit functions to delay the driving signal by the predetermined time, the beginning of the time when the Hi-signal of the driving signal and the Hi-signal of the NOT gate are input into the AND gate at the same time, i.e., the beginning of the time when the AND gate outputs the Hi-signal, and the positive control signal is input into the diode, is the time when the voltage level of the driving signal rises to the high level. This time corresponds to the beginning of the transition period in which the switching element switches from the off state to the on state. For example, when the switching element is in the off state, the forward current flows through the diode. When the switching element switches from the off state to the on state, and the reverse bias is applied to the diode, the reverse current starts to flow in the diode at a time when the switching element switches from the off state to the on state. As described above, when the timing adjusting unit functions to delay the driving signal by the predetermined time, the beginning of the time when the positive control signal is input into the diode corresponds to the beginning of the transition period in which the switching element switches from the off state to the on state. This is before the reverse current flows in the diode. Since the accumulation amount of the minority carrier accumulated in the first semiconductor layer is reduced before the reverse current flows in the diode, the switching loss is reduced. In a case where the timing adjusting unit functions to advance the driving signal by a predetermined time, the beginning of the time when the Hi-signal of the driving signal and the Hi-signal of the NOT gate are input into the AND gate at the same time, i.e., the beginning of the time when the positive control signal is input into the diode, is at the predetermined time before the voltage level of the driving signal falls to the low level. This is before the transition period in which the switching element switches from the on state to the off state. For example, under a condition that the switching element is in the on state, when the forward current flows in the diode, and the switching element switches from the on state to the off state, the reverse bias is applied to the diode. In this case, the reverse current starts to flow in the diode at a time when the switching element switches from the on state to the off state. As described above, when the timing adjusting unit functions to advance the driving signal by the predetermined time, the beginning of the time when the positive control signal is input into the diode is before the transition period in which the switching element switches from the on state to the off state. This is before the reverse current flows in the diode. Thus, the accumulation amount of the minority carrier accumulated in the first semiconductor layer is reduced before the reverse current flows in the diode. Thus, the switching loss is reduced. Here, when the both of two input signals are not the hi-signals, the AND gate outputs the Lo-signal. Accordingly, when the Hi-signal of the driving signal and the Hi-signal of the NOT gate are not input into the AND gate at the same time, the AND gate outputs the Lo-signal. As described above, the output signal of the AND gate corresponds to the control signal to be input into the diode. When the control signal is negative (i.e., when the voltage level is the low level), the injection amount of the minority carrier to be injected into the first semiconductor layer increases. Accordingly, when the forward current flows in the diode, the AND gate outputs the Lo-signal, so that the stationary loss is reduced. As described above, when the timing adjusting unit functions to delay the driving signal by the predetermined time, the switching element switches from the off state to the on state, and the reverse current flows in the diode, the beginning of the time when the positive control signal is input into the diode corresponds to the beginning of the transition period in which the switching element switches from the off state to the on state. Thus, when the forward current flows in the diode, the AND gate outputs the Lo-signal. Thus, the injection amount of the minority carrier to be injected into the first semiconductor layer increases, so that the stationary loss is reduced. Further, when the timing adjusting unit functions to advance the driving signal by the predetermined time, the switching element switches from the on state to the off state, and the reverse current flows in the diode, the beginning of the time when the positive control signal is input into the diode is before the transition period in which the switching element switches from the on state to the off state. Thus, since the AND gate outputs the Lo-signal when the forward current flows in the diode, the injection amount of the minority carrier to be injected into the first semiconductor layer increases so that the stationary loss is reduced.

Alternatively, the switching element may include a first switching element arranged on a power source side and a second switching element arranged on a ground side, the second switching element coupled in series with the first switching element between a power source and a ground. The diode may include a first diode coupled reversely in parallel to the first switching element and a second diode coupled reversely in parallel to the second switching element. The switching element and the diode provide at least a part of an inverter circuit. An induction type load is coupled to a connection point between the first switching element and the second switching element. The inverter circuit applies an alternating signal to the induction type load. The timing adjusting unit includes a first timing adjusting unit and a second timing adjusting unit. The first timing adjusting unit delays the driving signal to be input into the first switching element or the second switching element by a predetermined time. The second timing adjusting unit advances the driving signal to be input into the first switching element or the second switching element by a predetermined time. The NOT gate includes a first NOT gate and a second NOT gate. The first NOT gate reverses the polarity of the driving signal, the timing of which is delayed by the first timing adjusting unit. The second NOT gate reverses the polarity of the driving signal, the timing of which is advanced by the second timing adjusting unit. The AND gate includes a first AND gate, in which the driving signal and an output signal from the first NOT gate are input, and a second AND gate, in which the driving signal and an output signal from the second NOT gate are input. The control signal to be input into the control pad of the first diode is an output signal of the first AND gate. The control signal to be input into the control pad of the second diode is an output signal of the second AND gate.

Alternatively, the first timing adjusting unit may include a first resistor and a first capacitor having an electrostatic capacitance larger than a gate capacity of the first switching element or the second switching element, and the second timing adjusting unit may include a second resistor and a second capacitor having an electrostatic capacitance smaller than the gate capacity of the first switching element or the second switching element.

Alternatively, the switching element may include a first switching element arranged on a power source side and a second switching element arranged on a ground side and coupled in series with the first switching element between a power source and a ground. The diode may include a first diode coupled reversely in parallel to the first switching element and a second diode coupled reversely in parallel to the second switching element. The switching element and the diode provide at least a part of an inverter circuit for applying an alternating signal to an induction type load, which is coupled to a connection point between the first switching element and the second switching element. The driving signal generating unit includes a first driving signal generating unit for inputting a first driving signal into the first switching element and a second driving signal generating unit for inputting a second driving signal into the second switching element, the second driving signal generating unit having a polarity opposite to the first driving signal generating unit. The timing adjusting unit includes a first timing adjusting unit for delaying the first driving signal by a predetermined time and a second timing adjusting unit for delaying the second driving signal by a predetermined time. The NOT gate includes a first NOT gate for reversing a polarity of the first driving signal, a timing of which is delayed by the first timing adjusting unit, and a second NOT gate for reversing a polarity of the second driving signal, a timing of which is delayed by the second timing adjusting unit. The AND gate includes a first AND gate, in which the driving signal and an output signal from the first NOT gate are input, and a second AND gate, in which the driving signal and an output signal from the second NOT gate are input. The control signal to be input into the control pad of the first diode is an output signal of the first AND gate. The control signal to be input into the control pad of the second diode is an output signal of the second AND gate.

Further, the first timing adjusting unit may include a first resistor and a first capacitor having an electrostatic capacitance larger than a gate capacity of the second switching element, and the second timing adjusting unit may include a second resistor and a second capacitor having an electrostatic capacitance larger than the gate capacity of the second switching element.

Alternatively, the switching element may include a first switching element arranged on a power source side and a second switching element arranged on a ground side and coupled in series with the first switching element between a power source and a ground. The diode may include a first diode coupled reversely in parallel to the first switching element and a second diode coupled reversely in parallel to the second switching element. The switching element and the diode provide at least a part of an inverter circuit for applying an alternating signal to an induction type load, which is coupled to a connection point between the first switching element and the second switching element. The driving signal generating unit may include a first driving signal generating unit for inputting a first driving signal into the first switching element and a second driving signal generating unit for inputting a second driving signal into the second switching element, the second driving signal generating unit having a polarity opposite to the first driving signal generating unit. The timing adjusting unit may include a first timing adjusting unit for advancing the first driving signal by a predetermined time and a second timing adjusting unit for advancing the second driving signal by a predetermined time. The NOT gate may include a first NOT gate for reversing a polarity of the first driving signal, a timing of which is advanced by the first timing adjusting unit, and a second NOT gate for reversing a polarity of the second driving signal, a timing of which is advanced by the second timing adjusting unit. The AND gate may include a first AND gate, in which the driving signal and an output signal from the first NOT gate are input, and a second AND gate, in which the driving signal and an output signal from the second NOT gate are input. The control signal to be input into the control pad of the first diode is an output signal of the first AND gate. The control signal to be input into the control pad of the second diode is an output signal of the second AND gate.

Alternatively, the first timing adjusting unit may include a first resistor and a first capacitor having an electrostatic capacitance smaller than a gate capacity of the second switching element, and the second timing adjusting unit may include a second resistor and a second capacitor having an electrostatic capacitance smaller than the gate capacity of the second switching element.

Alternatively, the second electrode may be adjacent to the control pad via an insulation film. The control electrode is formed at a plurality of positions between the second electrode and the first surface of the first semiconductor layer via the insulation member. A formation density of the control electrode becomes high as it goes from a center of a forming region of the control electrode to a periphery. In a case where the forward bias is applied to the diode so that the minority carrier is injected from the second semiconductor layer into the first semiconductor layer, and the forward current flows in the diode, the forward bias applied to the diode is released. Thus, the carrier accumulated in the first semiconductor layer flows into the second semiconductor layer. Specifically, the reverse current flows between the first electrode and the second electrode. In this case, as described in the above device, when the second electrode is adjacent to the control pad via the insulation film, the minority carrier accumulated in a part of the first semiconductor layer near the second electrode and the insulation film may concentrate at and flow through the contact portion between the second electrode and the insulation film. In this case, the contact portion may be broken. However, in the above device, the formation density of the control electrode becomes high as it goes from the center position to a periphery in the formation region of the control electrode. Accordingly, when the positive control signal is input into the control electrode, the concentration distribution of the minority carrier accumulated in the first semiconductor layer becomes low as it goes from the center of the formation region to the periphery. Specifically, the accumulation amount of the minority carrier accumulated in the part of the first semiconductor layer near the second electrode and the insulation film is reduced to be smaller than that in the center of the formation region. Thus, the reverse current amount is reduced, and the breakdown of the contact portion is restricted.

Alternatively, the second electrode may be adjacent to the control pad via an insulation film. The control electrode is formed at a plurality of positions between the second electrode and the first surface of the first semiconductor layer via the insulation member, and a formation density of the control electrode becomes low as it goes from a center of a forming region of the control electrode to a periphery. Thus, when the negative control signal is input into the control electrode, the concentration distribution of the minority carrier accumulated in the first semiconductor layer becomes low as it goes from the center to the periphery of the formation region.

Alternatively, the semiconductor substrate may be divided to a first formation region, in which the diode is formed, and a second formation region, in which the switching element is formed, the switching element controlling to open and to close according to the driving signal, a voltage level of which is switched. A third semiconductor layer having the first conductive type and a gate electrode for applying the driving signal between the third semiconductor layer and the second semiconductor layer are formed in the second semiconductor layer of the second formation region, and the first formation region is adjacent to the second formation region. When the switching element is in the off state, and the reverse current flows in the diode, a part of the reverse current flows into the switching element, and therefore, the switching element may malfunction. However, in the above device, the diode and the switching element are formed in the semiconductor substrate, and the first formation region in which the diode is formed is adjacent to the second formation region in which the switching element is formed. In this case, when the switching element is in the off state, and the current flowing through the diode switches from the forward current to the reverse current, the positive control signal is applied to the control electrode, so that the accumulation amount of the minority carrier accumulated in the first semiconductor layer is reduced. Thus, the reverse current amount is reduced, and therefore, the reverse current amount to flow into the switching element is reduced, and the malfunction of the switching element is restricted. Further, when the switching element and the diode are formed in the same semiconductor layer, the impurity concentration of each semiconductor layer for providing the switching element and the diode is determined to be a concentration suitable for the switching element, in general. Accordingly, in the above device, a problem is raised such that the impurity concentration of each semiconductor layer is not determined to be a concentration suitable for the diode. However, the semiconductor device according to the present invention includes the controller for adjusting the injection amount of the minority carrier. Accordingly, when the control signal to be input into the control electrode is adjusted, the impurity concentration of the second semiconductor layer is controlled to be a concentration suitable for the diode apparently. For example, when the positive control signal is applied to the control electrode, the impurity concentration of the second semiconductor layer becomes low apparently. When the negative control signal is applied to the control electrode, the impurity concentration of the second semiconductor layer becomes high apparently.

Alternatively, a trench may be formed on the first surface of the first semiconductor layer. An inner wall of the trench is covered with a first insulation film. The first insulation film provides a concavity, which is filled with a conductive member. A part of an opening of the concavity is sealed with a second insulation film. The insulation member is composed of the first insulation film and the second insulation film. The control electrode is provided by the conductive member.

According to a second aspect of the present disclosure, a semiconductor device includes: a collector layer having a first conductive type; a drift layer having a second conductive type and arranged on the collector layer; a base region having the first conductive type and formed on the drift layer in a cell region; a first trench extending along with one direction as a longitudinal direction and formed to penetrate the base region and to reach the drift region so that the base region is divided into a plurality of portions; an emitter region, having the second conductive type and formed at least a part of the divided portions of the base region to contact a sidewall of the first trench, in the base region; a gate insulation film formed on an inner surface of the first trench; a gate electrode, formed on the gate insulation film in the first trench; an emitter electrode electrically coupled with the emitter region, and a collector electrode formed on a backside of the collector layer; a second trench formed on the backside of the collector layer, which is opposite to the drift layer; a gate insulation film formed on an inner surface of the second trench; and a control gate electrode formed on the gate insulation film in the second trench. The collector layer, the drift layer, the base region, the trench, the emitter region, the gate insulation film, the gate electrode and the collector electrode provide an insulated gate type semiconductor device.

Thus, the control gate electrode for controlling the carrier amount in the collector layer is formed in the cell region, in which the insulated gate type semiconductor device is arranged. Accordingly, even after the device manufacturing process ends, the semiconductor device can adjust and optimize the stationary loss and the switching loss.

Alternatively, the second trench may penetrate the collector layer.

Alternatively, a field stop layer having the second conductive type may be arranged between the collector layer and the drift layer, the field stop layer having an impurity concentration higher than the drift layer.

Alternatively, the second trench may penetrate not only the collector layer but also the field stop layer. Thus, since the trench on the backside penetrates the FS layer, the control gate electrode can adjust the carrier amount in the FS layer.

Alternatively, a first conductive type layer may be formed between the field stop layer and the drift layer. The collector layer, the field stop layer, the first conductive type layer and the control gate electrode in the trench provide a trench gate structure MOSFET on the backside.

Alternatively, the second trench may not penetrate the field stop layer.

Alternatively, the semiconductor device may further include: an outer periphery region having an outer periphery break down voltage structure surrounding the cell region. The trench on the backside, the gate insulation film formed on the inner surface of the trench and the control gate electrode are arranged in the outer periphery region. Thus, the control gate electrode is aloes formed in the outer periphery region. The electric connection between the control gate electrode arranged in the cell region and the control gate electrode arranged in the outer periphery region is performed in the outer periphery region.

Alternatively, each of the control gate electrode in the cell region and the control gate electrode in the outer periphery region may be electrically coupled with an outer periphery electrode formed in the outer periphery region.

Alternatively, each of the control gate electrode in the cell region and the control gate electrode in the outer periphery region may be electrically coupled with a wiring layer, which is arranged in a through hole formed to penetrate the drifty layer in the outer periphery region. The control gate electrode is retrieved from the backside to a foreside opposite to the backside.

Alternatively, a distance between adjacent control gate electrodes formed in the outer periphery region may be narrower than a distance between adjacent control gate electrodes formed in the cell region. In this case, the formation density of the control gate electrode in the outer periphery region is higher than that in the cell region. Thus, for example, when the collector layer corresponding to the collector region has the P conductive type, and the positive voltage with respect to the collector region is applied to the control gate electrode, the minority carrier amount to be injected into the outer periphery region is limited to be smaller than the minority carrier amount to be injected from the cell region. Accordingly, the device breakdown caused by carrier concentration at the end portion of the cell region is restricted.

Alternatively, a first portion of the control gate electrode formed in the cell region may be electrically separated from a second portion of the control gate electrode formed in the outer periphery region. The first portion and the second portion are electrically coupled with individual electrodes, respectively. In this case, a part of the control gate electrode formed in the cell region and another part of the control gate electrode formed in the outer periphery region are controlled to have different potentials, respectively.

While example embodiments have been described above, it is to be understood that the invention is not limited to the example embodiments and constructions. The invention is intended to cover various modification and equivalent arrangements. In addition, while the various combinations and configurations, which are exemplary, other combinations and configurations, including more, less or only a single element, are also within the spirit and scope of the invention.

The invention claimed is:

1. A semiconductor device comprising:
a semiconductor substrate including a first semiconductor layer having a first conductive type and at least one second semiconductor layer having a second conductive type and formed in a surface portion of a first surface of the first semiconductor layer;
a diode including a first electrode and a second electrode;
a control pad;
a control electrode electrically coupled with the control pad;
a switching element for controlling to open and to close according to a driving signal, a voltage level of which is switched; and
an insulation member, wherein
the first electrode is formed on a second surface of the first semiconductor layer,
the second electrode is formed on the first surface of the first semiconductor layer,
current flows between the first electrode and the second electrode,
the control pad is arranged on the first surface of the first semiconductor layer, and the control pad inputs a control signal for controlling an injection amount of a carrier into the first semiconductor layer,
the insulation member insulates between the control electrode and the second electrode and between the control electrode and the semiconductor substrate,
the diode is coupled in series with the switching element, and
a polarity and an amplitude of the control signal are determined based on a frequency of the driving signal.

2. The semiconductor device according to claim 1,
wherein the second electrode is adjacent to the control pad via an insulation film,
wherein the control electrode is formed at a plurality of positions between the second electrode and the first surface of the first semiconductor layer via the insulation member, and
wherein a formation density of the control electrode becomes high as it goes from a center of a forming region of the control electrode to a periphery.

3. The semiconductor device according to claim 1,
wherein the second electrode is adjacent to the control pad via an insulation film,
wherein the control electrode is formed at a plurality of positions between the second electrode and the first surface of the first semiconductor layer via the insulation member, and
wherein a formation density of the control electrode becomes low as it goes from a center of a forming region of the control electrode to a periphery.

4. The semiconductor device according to claim 1,
wherein the semiconductor substrate is divided to a first formation region, in which the diode is formed, and a second formation region, in which the switching element is formed, the switching element controlling to open and to close according to the driving signal, a voltage level of which is switched,
wherein a third semiconductor layer having the first conductive type and a gate electrode for applying the driving signal between the third semiconductor layer and the second semiconductor layer are formed in the second semiconductor layer of the second formation region, and
wherein the first formation region is adjacent to the second formation region.

5. The semiconductor device according to claim 1,
wherein a trench is formed on the first surface of the first semiconductor layer,
wherein an inner wall of the trench is covered with a first insulation film,
wherein the first insulation film provides a concavity, which is filled with a conductive member,
wherein a part of an opening of the concavity is sealed with a second insulation film,
wherein the insulation member is composed of the first insulation film and the second insulation film, and
wherein the control electrode is provided by the conductive member.

6. A semiconductor device comprising:
a semiconductor substrate including a first semiconductor layer having a first conductive type and at least one second semiconductor layer having a second conductive type and formed in a surface portion of a first surface of the first semiconductor layer;
a diode including a first electrode and a second electrode;
a control pad;
a control electrode electrically coupled with the control pad;
an insulation member; and
a temperature sensor for detecting temperature of the semiconductor substrate, wherein
the first electrode is formed on a second surface of the first semiconductor layer,
the second electrode is formed on the first surface of the first semiconductor layer,
current flows between the first electrode and the second electrode,
the control pad is arranged on the first surface of the first semiconductor layer, and the control pad inputs a control signal for controlling an injection amount of a carrier into the first semiconductor layer,
the insulation member insulates between the control electrode and the second electrode and between the control electrode and the semiconductor substrate, and
a polarity and an amplitude of the control signal are determined based on an output signal of the temperature sensor.

7. A semiconductor device comprising:
a semiconductor substrate including a first semiconductor layer having a first conductive type and at least one second semiconductor layer having a second conductive type and formed in a surface portion of a first surface of the first semiconductor layer;
a diode including a first electrode and a second electrode;
a control pad;
a control electrode electrically coupled with the control pad;
an insulation member; and a switching element for controlling to open and to close according to a driving signal, a voltage level of which is switched, wherein the first electrode is formed on a second surface of the first semiconductor layer, the second electrode is formed on the first surface of the first semiconductor layer, current flows between the first electrode and the second electrode, the control pad is arranged on the first surface of the first semiconductor layer, and the control pad inputs a control signal for controlling an injection amount of a carrier into the first semiconductor layer, the insulation member insulates between the control electrode and the second electrode and between the control electrode and the semiconductor substrate, the diode is coupled in series with the switching element, and a polarity of the control signal is determined based on a timing for flowing a forward current through the diode and a timing for switching current flowing through the diode from the forward current to a reverse current.

8. A semiconductor device comprising:

a semiconductor substrate including a first semiconductor layer having a first conductive type and at least one second semiconductor layer having a second conductive type and formed in a surface portion of a first surface of the first semiconductor layer;

a diode including a first electrode and a second electrode;

a control pad;

a control electrode electrically coupled with the control pad;

an insulation member;

a switching element for controlling to open and to close according to a driving signal, a voltage level of which is switched, wherein the diode is coupled in series with the switching element;

a driving signal generating unit for generating the driving signal;

a timing adjusting unit for delaying or advancing the driving signal by a predetermined time;

a NOT gate for reversing the polarity of the driving signal, timing of which is adjusted by the timing adjusting unit; and an AND gate for inputting the driving signal and an output signal from the NOT gate, wherein the control signal is an output signal from the AND gate, the first electrode is formed on a second surface of the first semiconductor layer, the second electrode is formed on the first surface of the first semiconductor layer, current flows between the first electrode and the second electrode, the control pad is arranged on the first surface of the first semiconductor layer, and the control pad inputs a control signal for controlling an injection amount of a carrier into the first semiconductor layer, and the insulation member insulates between the control electrode and the second electrode and between the control electrode and the semiconductor substrate.

9. The semiconductor device according to claim 8, wherein the switching element includes a first switching element arranged on a power source side and a second switching element arranged on a ground side, the second switching element coupled in series with the first switching element between a power source (Vcc) and a ground, wherein the diode includes a first diode coupled reversely in parallel to the first switching element and a second diode coupled reversely in parallel to the second switching element, wherein the switching element and the diode provide at least a part of an inverter circuit, wherein an induction type load is coupled to a connection point between the first switching element and the second switching element, wherein the inverter circuit applies an alternating signal to the induction type load, wherein the timing adjusting unit includes a first timing adjusting unit and a second timing adjusting unit, wherein the first timing adjusting unit delays the driving signal to be input into the first switching element or the second switching element by a predetermined time, wherein the second timing adjusting unit advances the driving signal to be input into the first switching element or the second switching element by a predetermined time, wherein the NOT gate includes a first NOT gate and a second NOT gate, wherein the first NOT gate reverses the polarity of the driving signal, the timing of which is delayed by the first timing adjusting unit, wherein the second NOT gate reverses the polarity of the driving signal, the timing of which is advanced by the second timing adjusting unit, wherein the AND gate includes a first AND gate, in which the driving signal and an output signal from the first NOT gate are input, and a second AND gate, in which the driving signal and an output signal from the second NOT gate are input, wherein the control signal to be input into the control pad of the first diode is an output signal of the first AND gate, and wherein the control signal to be input into the control pad of the second diode is an output signal of the second AND gate.

10. The semiconductor device according to claim 9, wherein the first timing adjusting unit includes a first resistor and a first capacitor having an electrostatic capacitance larger than a gate capacity of the first switching element or the second switching element, and wherein the second timing adjusting unit includes a second resistor and a second capacitor having an electrostatic capacitance smaller than the gate capacity of the first switching element or the second switching element.

11. The semiconductor device according to claim 8, wherein the switching element includes a first switching element arranged on a power source side and a second switching element arranged on a ground side and coupled in series with the first switching element between a power source and a ground, wherein the diode includes a first diode coupled reversely in parallel to the first switching element and a second diode coupled reversely in parallel to the second switching element, wherein the switching element and the diode provide at least a part of an inverter circuit for applying an alternating signal to an induction type load, which is coupled to a connection point between the first switching element and the second switching element, wherein the driving signal generating unit includes a first driving signal generating unit for inputting a first driving signal into the first switching element and a second driving signal generating unit for inputting a second driving signal into the second switching element, the second driving signal generating unit having a polarity opposite to the first driving signal generating unit, wherein the timing adjusting unit includes a first timing adjusting unit for delaying the first driving signal by a predetermined time and a second timing adjusting unit for delaying the second driving signal by a predetermined time, wherein the NOT gate includes a first NOT gate for reversing a polarity of the first driving signal, a timing of which is delayed by the first timing adjusting unit, and a second NOT gate for reversing a polarity of the second driving signal, a timing of which is delayed by the second timing adjusting unit, wherein the AND gate includes a first AND gate, in which the driving signal and an output signal from the first NOT gate are input, and a second AND gate, in which the driving signal and an output signal from the second NOT gate are input, wherein the control signal to be input into the control pad of the first diode is an output signal of the first AND gate, and wherein the control signal to be input into the control pad of the second diode is an output signal of the second AND gate.

12. The semiconductor device according to claim 11, wherein the first timing adjusting unit includes a first resistor and a first capacitor having an electrostatic capacitance larger than a gate capacity of the second switching element, and wherein the second timing adjusting unit includes a second resistor and a second capacitor having an electrostatic capacitance larger than the gate capacity of the second switching element.

13. The semiconductor device according to claim 8, wherein the switching element includes a first switching element arranged on a power source side and a second switching element arranged on a ground side and coupled in series with the first switching element between a power source and a ground, wherein the diode includes a first diode coupled reversely in parallel to the first switching element and a second diode coupled reversely in parallel to the second switching element, wherein the switching element and the diode provide at least a part of an inverter circuit for applying an alternating signal to an induction type load, which is coupled to a connection point between the first switching element and the second switching element, wherein the driving signal generating unit includes a first driving signal generating unit for inputting a first driving signal into the first switching element and a second driving signal generating unit for inputting a second driving signal into the second switching element, the second driving signal generating unit having a polarity opposite to the first driving signal generating unit, wherein the timing adjusting unit includes a first timing adjusting unit for advancing the first driving signal by a predetermined time and a second timing adjusting unit for advancing the second driving signal by a predetermined time, wherein the NOT gate includes a first NOT gate for reversing a polarity of the first driving signal, a timing of which is advanced by the first timing adjusting unit, and a second NOT gate for reversing a polarity of the second driving signal, a timing of which is advanced by the second timing adjusting unit, wherein the AND gate includes a first AND gate, in which the driving signal and an output signal from the first NOT gate are input, and a second AND gate, in which the driving signal and an output signal from the second NOT gate are input, wherein the control signal to be input into the control pad of the first diode is an output signal of the first AND gate, and wherein the control signal to be input into the control pad of the second diode is an output signal of the second AND gate.

14. The semiconductor device according to claim 13, wherein the first timing adjusting unit includes a first resistor and a first capacitor having an electrostatic capacitance smaller than a gate capacity of the second switching element, and wherein the second timing adjusting unit includes a second resistor and a second capacitor having an electrostatic capacitance smaller than the gate capacity of the second switching element.

15. A semiconductor device comprising:

a collector layer having a first conductive type;

a drift layer having a second conductive type and arranged on the collector layer;

a base region having the first conductive type and formed on the drift layer in a cell region;

a first trench extending along with one direction as a longitudinal direction and formed to penetrate the base region and to reach the drift region so that the base region is divided into a plurality of portions;

an emitter region having the second conductive type and formed at least a part of the divided portions of the base region to contact a sidewall of the first trench in the base region;

a gate insulation film formed on an inner surface of the first trench;

a gate electrode formed on the gate insulation film in the first trench;

an emitter electrode electrically coupled with the emitter region, and a collector electrode formed on a backside of the collector layer;

a second trench formed on the backside of the collector layer, which is opposite to the drift layer;

a gate insulation film formed on an inner surface of the second trench; and a control gate electrode formed on the gate insulation film in the second trench, wherein the collector layer, the drift layer, the base region, the trench, the emitter region, the gate insulation film, the gate electrode and the collector electrode provide an insulated gate type semiconductor device.

16. The semiconductor device according to claim 15, wherein the second trench penetrates the collector layer.

17. The semiconductor device according to claim 15, wherein a field stop layer having the second conductive type is arranged between the collector layer and the drift layer, the field stop layer having an impurity concentration higher than the drift layer.

18. The semiconductor device according to claim 17, wherein the second trench does not penetrate the field stop layer.

19. The semiconductor device according to claim 17, wherein the second trench penetrates not only the collector layer but also the field stop layer.

20. The semiconductor device according to claim 19, wherein a first conductive type layer is formed between the field stop layer and the drift layer, and wherein the collector layer, the field stop layer, the first conductive type layer and the control gate electrode in the trench provide a trench gate structure MOSFET on the backside.

21. The semiconductor device according to claim 15, further comprising:
an outer periphery region having an outer periphery break down voltage structure surrounding the cell region,
wherein the trench on the backside, the gate insulation film formed on the inner surface of the trench and the control gate electrode are arranged in the outer periphery region.

22. The semiconductor device according to claim 21,
wherein each of the control gate electrode in the cell region and the control gate electrode in the outer periphery region is electrically coupled with an outer periphery electrode formed in the outer periphery region.

23. The semiconductor device according to claim 21,
wherein each of the control gate electrode in the cell region and the control gate electrode in the outer periphery region is electrically coupled with a wiring layer, which is arranged in a through hole formed to penetrate the drifty layer in the outer periphery region,
wherein the control gate electrode is retrieved from the backside to a foreside opposite to the backside.

24. The semiconductor device according to claim 21,
wherein a distance between adjacent control gate electrodes formed in the outer periphery region is narrower than a distance between adjacent control gate electrodes formed in the cell region.

25. The semiconductor device according to claim 21,
wherein a first portion of the control gate electrode formed in the cell region is electrically separated from a second portion of the control gate electrode formed in the outer periphery region, and
wherein the first portion and the second portion are electrically coupled with individual electrodes, respectively.

* * * * *